(12) United States Patent
Tanner

(10) Patent No.: US 11,007,721 B2
(45) Date of Patent: *May 18, 2021

(54) THREE DIMENSIONAL PRINTING SYSTEM WITH IMPROVED RELIABILITY, SAFETY, AND QUALITY

(71) Applicant: 3D Systems, Inc., Rock Hill, SC (US)

(72) Inventor: Christopher Tanner, San Diego, CA (US)

(73) Assignee: 3D Systems, Inc., Rock Hill, SC (US)

( * ) Notice: Subject to any disclaimer, the term of this patent is extended or adjusted under 35 U.S.C. 154(b) by 354 days.

This patent is subject to a terminal disclaimer.

(21) Appl. No.: 15/720,707

(22) Filed: Sep. 29, 2017

(65) Prior Publication Data

US 2018/0345584 A1   Dec. 6, 2018

Related U.S. Application Data

(63) Continuation-in-part of application No. 15/612,228, filed on Jun. 2, 2017, now Pat. No. 10,639,880.

(51) Int. Cl.
 *B29C 64/40* (2017.01)
 *B33Y 30/00* (2015.01)
 (Continued)

(52) U.S. Cl.
 CPC ............ *B29C 64/40* (2017.08); *B29C 64/124* (2017.08); *B29C 64/245* (2017.08);
 (Continued)

(58) Field of Classification Search
 CPC ......... B33Y 10/00; B33Y 30/00; B33Y 50/00; B33Y 70/00; B33Y 90/00; B29C 64/10;
 (Continued)

(56) References Cited

U.S. PATENT DOCUMENTS

| 5,447,822 A * | 9/1995 | Hull ...................... B29C 64/135 430/269 |
| 6,187,394 B1 * | 2/2001 | Johnson .................. G09F 13/24 119/245 |

(Continued)

FOREIGN PATENT DOCUMENTS

| CN | 204183908 U | 3/2015 |
| CN | 204894534 U | 12/2015 |

(Continued)

OTHER PUBLICATIONS

PCT International Search Report for International Search Authority for PCT/US2018/033201, dated Sep. 11, 2018 (7 pages).

(Continued)

*Primary Examiner* — Jacob T Minskey
*Assistant Examiner* — S. Behrooz Ghorishi

(57) ABSTRACT

A three dimensional printing system includes a vertical support, a support plate, a resin vessel, a fluid spill containment vessel, and a light engine. The support plate is affixed to the vertical support at a proximal end. The support plate has an inner surface defining a first central opening. The resin vessel is supported above the support plate and has an inner edges surrounding a second central opening. The resin vessel includes a transparent sheet that closes the second central opening. The fluid spill containment vessel is supported below the support plate and includes a transparent window. The light engine is supported below the fluid spill containment vessel. The first central opening, the second central opening, and the window laterally overlap to provide an optical path whereby the light engine can project light upwardly to a build plane in the resin vessel.

14 Claims, 22 Drawing Sheets

(51) Int. Cl.
*B33Y 40/00* (2020.01)
*G03F 7/20* (2006.01)
*B29C 64/245* (2017.01)
*B29C 64/30* (2017.01)
*B29C 64/255* (2017.01)
*B33Y 10/00* (2015.01)
*B29C 64/124* (2017.01)
*B33Y 50/02* (2015.01)
*B29C 64/205* (2017.01)
*B29C 64/227* (2017.01)

(52) U.S. Cl.
CPC ............ *B29C 64/255* (2017.08); *B29C 64/30* (2017.08); *B33Y 10/00* (2014.12); *B33Y 30/00* (2014.12); *B33Y 40/00* (2014.12); *G03F 7/70416* (2013.01); *B29C 64/205* (2017.08); *B29C 64/227* (2017.08); *B33Y 50/02* (2014.12)

(58) Field of Classification Search
CPC ......... B29C 64/20; B29C 64/30; B29C 64/40; B29C 64/165; B29C 64/112
See application file for complete search history.

(56) References Cited

U.S. PATENT DOCUMENTS 9,821,543 B1 * 11/2017 Crear .................... B33Y 40/00
2015/0375458 A1   12/2015 Chen et al.
2017/0113416 A1 *  4/2017 DeSimone ............ B33Y 10/00

FOREIGN PATENT DOCUMENTS

DE      102012011610 A1    11/2012
WO       2014130610 A2     8/2014

OTHER PUBLICATIONS

PCT Written Opinion for International Search Authority for PCT/US2018/033201, dated Sep. 11, 2018 (9 pages).

English translation of Chinese Publication No. CN.204894534.U, http://tfly:internal.epo.org/htlm/blankPage, translated Aug. 30, 2018 (7 pages).

English translation of Chinese Publication No. CN.204183908.U, http://tfly:internal.epo.org/htlm/blankPage, translated Aug. 30, 2018 (7 pages).

* cited by examiner

THREE DIMENSIONAL PRINTING SYSTEM WITH IMPROVED RELIABILITY, SAFETY, AND QUALITY

RELATED APPLICATIONS

The present application is a continuation-in-part of patent application Ser. No. 15/612,228 entitled "THREE DIMENSIONAL PRINTING SYSTEM WITH IMPROVED MACHINE ARCHITECTURE" filed on Jun. 2, 2017.

FIELD OF THE INVENTION

The present disclosure concerns an apparatus and method for fabrication of solid three dimensional (3D) articles of manufacture from radiation curable (photocurable) resins. More particularly, the present invention provides a machine architecture that enhances reliability, safety and quality.

BACKGROUND

Three dimensional (3D) printers are in rapidly increasing use. One class of 3D printers includes stereolithography printers having a general principle of operation including the selective curing and hardening of radiation curable (photocurable) liquid resins. A typical stereolithography system includes a resin vessel holding the photocurable resin, a movement mechanism coupled to a support surface, and a controllable light engine. The stereolithography system forms a three dimensional (3D) article of manufacture by selectively curing layers of the photocurable resin. Each selectively cured layer is formed at or proximate to a "build plane" within the resin.

One challenge with stereolithography systems is the reliability and maintenance in working with liquid resins. As stereolithography systems become more automated, there is a need to continually improve safety, reliability, and repeatability of the systems.

SUMMARY

Figure 1A:
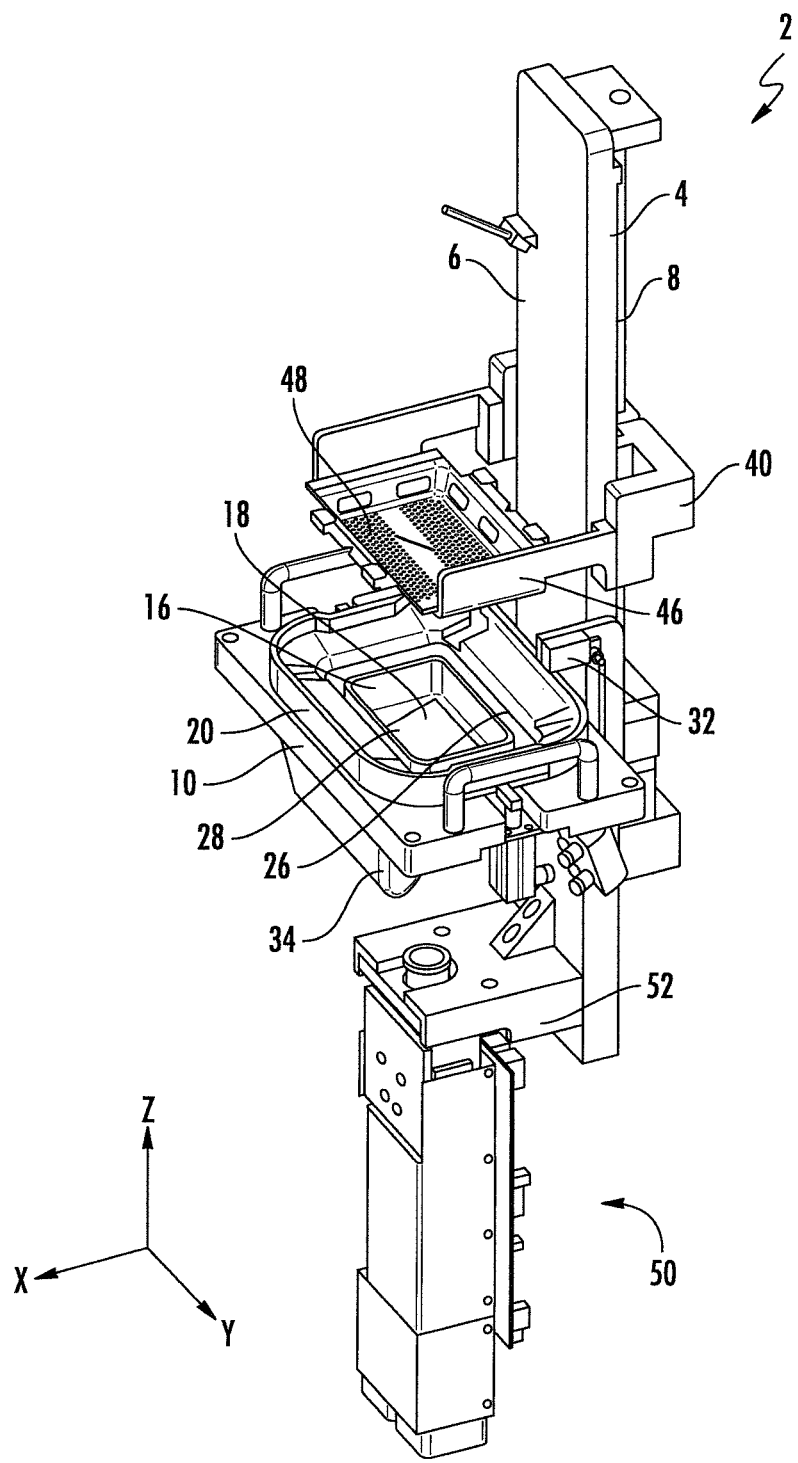
FIG. 1A is an isometric drawing depicting an exemplary three dimensional printing system.

In a first aspect of the disclosure, a three dimensional printing system includes a vertical support, a support plate, a resin vessel, a fluid spill containment vessel, and a light engine. The support plate is affixed to the vertical support at a proximal end. The support plate extends along a first lateral axis from the proximal end to a distal end. The support plate has an inner surface defining a first central opening. The resin vessel is supported above the support plate and has inner edges surrounding a second central opening. The resin vessel includes a transparent sheet that closes the second central opening. The fluid spill containment vessel is supported below the support plate and includes a transparent window. The light engine is supported below the fluid spill containment vessel. The first central opening, the second central opening, and the window laterally overlap to provide an optical path whereby the light engine can project light upwardly to a build plane in the resin vessel.

In one implementation the fluid spill containment vessel is configured to mount directly to a lower side of the support plate. A pair of rails are mounted to a lower side of the support plate. The fluid spill containment vessel includes a pair of lips that extend along the first lateral axis. The pair of lips are configured to be received into the pair of rails to thereby mount the fluid spill containment vessel to the lower side of the support plate.

In another implementation the fluid spill containment vessel is configured to mount directly to the vertical support.

In yet another implementation the fluid spill containment vessel has distal and proximal ends, the fluid spill containment vessel generally tapers from the distal end to the proximal end. The fluid spill containment vessel has a downwardly extending trough that is located at or adjacent to the distal end. The transparent window is positioned proximate to the proximal end of the fluid spill containment vessel to allow resin to drain from the window and into the trough. The distal and proximal ends of the fluid spill containment vessel correspond to the distal and proximal ends of the support plate whereby the fluid spill containment vessel generally tapers along the lateral axis along a direction from the distal to the proximal ends of the support plate.

In a further implementation the three dimensional printing system includes a sensor configured to detect a fluid level in the fluid spill containment vessel and a controller configured to receive a signal from the sensor and to generate a warning if a fluid level in the fluid spill containment vessel exceeds a threshold value.

In another implementation the fluid spill containment vessel includes a fluid drain configured to allow resin to drain from the fluid spill containment vessel. The three dimensional printing system includes a drain conduit positioned below the fluid drain when the fluid spill containment vessel is installed in the three dimensional printing system. The fluid drain automatically opens when the fluid spill containment vessel is installed in the three dimensional printing system whereby resin in the fluid spill containment vessel will drain into the drain conduit.

DETAILED DESCRIPTION OF THE PREFERRED EMBODIMENTS

Figure 1B:
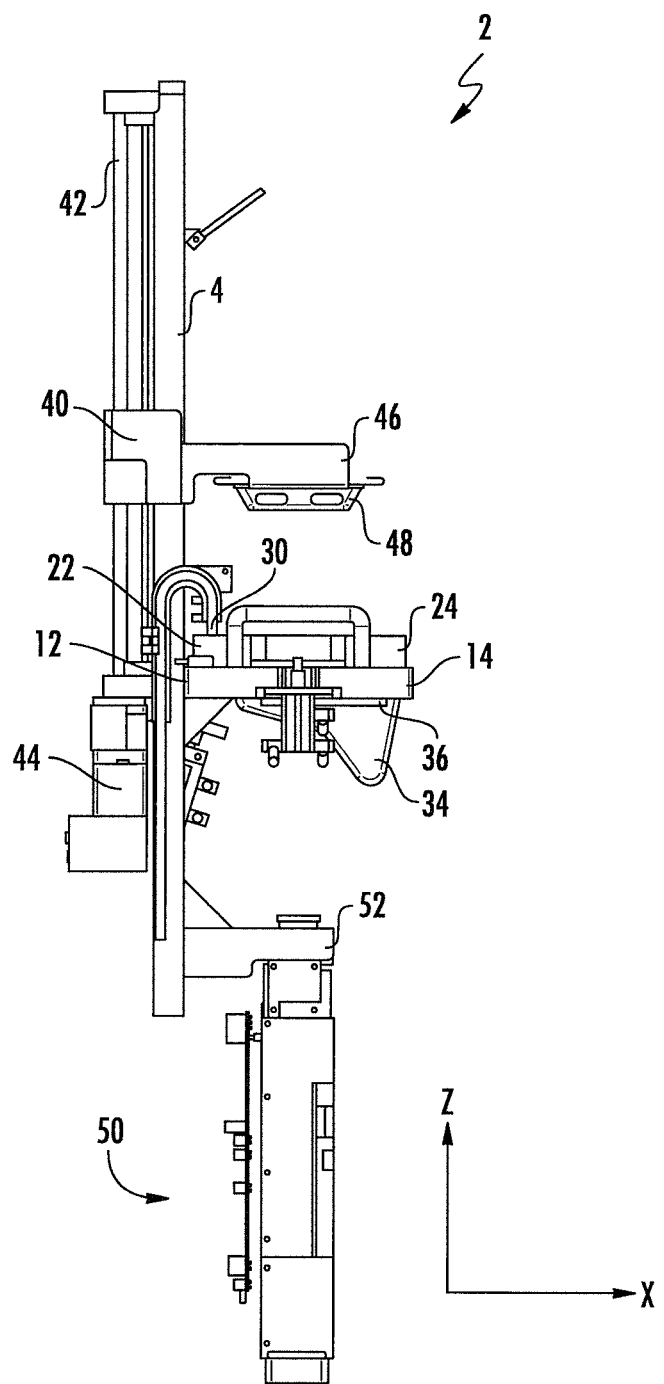
FIG. 1B is a side view of an exemplary three dimensional printing system.
Figure 1C:
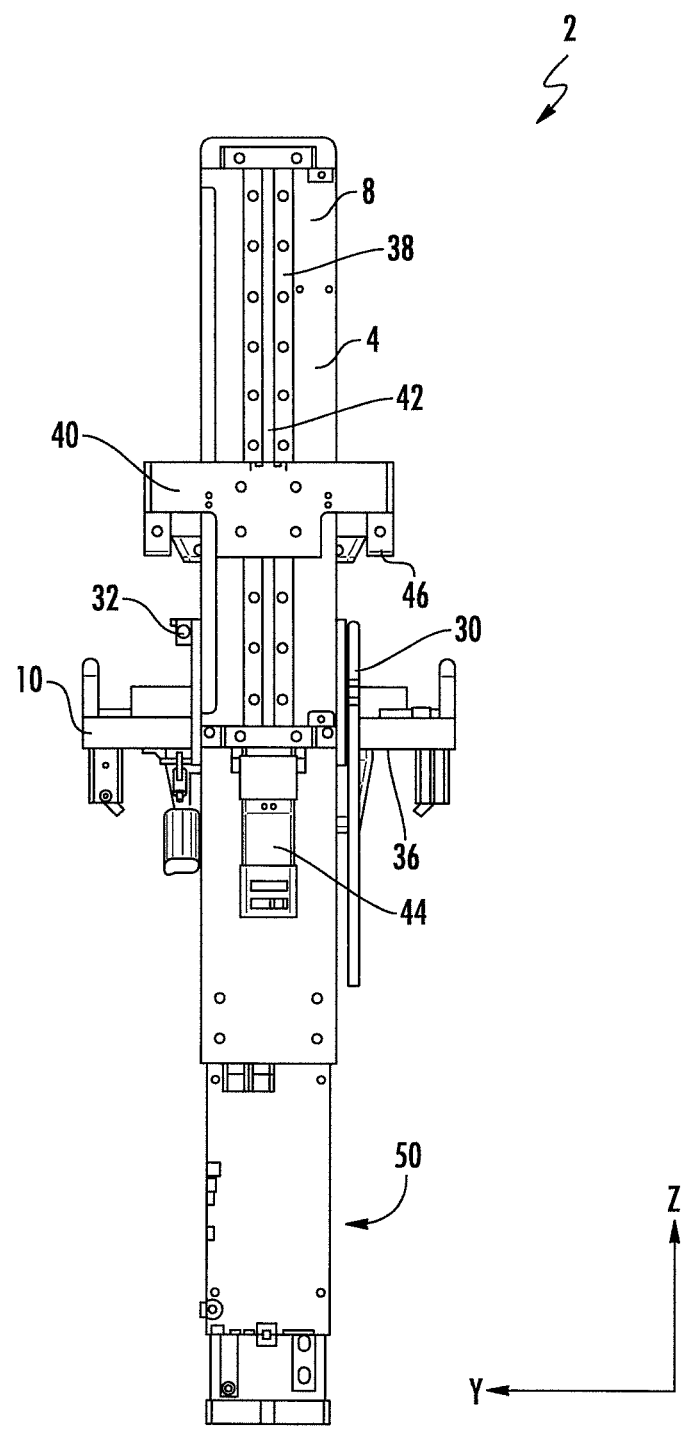
FIG. 1C is a rear view of an exemplary three dimensional printing system.

FIGS. 1A-C are views of an exemplary three dimensional (3D) printing system 2. FIG. 1A is an isometric view, FIG. 1B is a side view, and FIG. 1C is a rear view. In describing printing system 2 axes X, Y, and Z are used to illustrate positions, directions, and motions. Axes X, Y, and Z are mutually orthogonal. Axes X and Y are "lateral" or "horizontal" axes. Axis Z is a "vertical" axis. Axis Z is typically aligned or nearly aligned with a gravitational reference. In describing directions the following conventions will be used: +Y is to the "right" and −Y is to the "left." +Z is generally upward and −Z is generally downward.

Three dimensional printing system 2 includes a vertical support 4 having a front side 6 and a back side 8. Vertical support 4 generally provides a "vertical backbone" from which other components of three dimensional printing system 2 are mounted.

A support plate 10 is mounted to the vertical support 4. Support plate 10 has a proximal end 12 that is proximate to the front side 6 of vertical support 4. Support plate 10 extends from proximal end 12 to distal end 14 along the lateral axis X. Support plate 10 has an inner surface 16 facing inwardly and defining a central opening 18.

A resin vessel 20 is supported by the support plate 10. The resin vessel 20 has a rear portion 22 that is proximate to the proximal end 12 of the support plate 10. The resin vessel 20 has a front portion 24 that is proximate to the distal end 14 of the support plate 10. Resin vessel 20 has an inner edge 26 that surrounds a central opening 28. The central openings 18 and 28 are laterally aligned with respect to each other to enable an optical path for vertically projected pixelated light. Central opening 28 is laterally contained within central opening 18.

A resin fluid outlet 30 is positioned over the rear portion 22 of resin vessel 20. A fluid level sensor 32 is positioned over the rear portion 22 of the resin vessel 20. The resin fluid outlet 30 and fluid level sensor 32 are separated from each other along the lateral axis Y.

A fluid spill containment vessel 34 is releasably mounted to a lower side 36 of the support plate 10. Fluid spill containment vessel 34 is for capturing any resin spills resulting from damage to or overfilling of the resin vessel 20. The fluid spill containment vessel 34 includes a window (to be discussed below). The window is laterally aligned with the central openings 18 and 28 to enable the aforementioned optical path for vertically projected pixelated light.

Mounted to the rear side 8 of vertical support 4 is a vertical track 38. A carriage 40 is mounted in sliding engagement with the vertical track 38. A motorized lead screw 42 is configured to drive the carriage 40 along vertical axis Z. The lead screw 42 is coupled to motor system 44 which rotates the lead screw 42 to drive the carriage 40 vertically along the vertical track 38. A pair of fixture receiving arms 46 extend from the carriage 40 along the lateral axis X. Supported between the receiving arms 46 is a support fixture 48.

A light engine 50 is mounted to the vertical support 4 via a support bracket 52. Support bracket 52 extends away from the front side 6 of vertical support 4 along lateral axis X. Pixelated light from light engine 50 is projected vertically upwardly. The pixelated light passes through the fluid spill containment vessel 34, the support plate 10, and the vessel 20 to a build plane within the resin vessel 20.

Figure 2A:
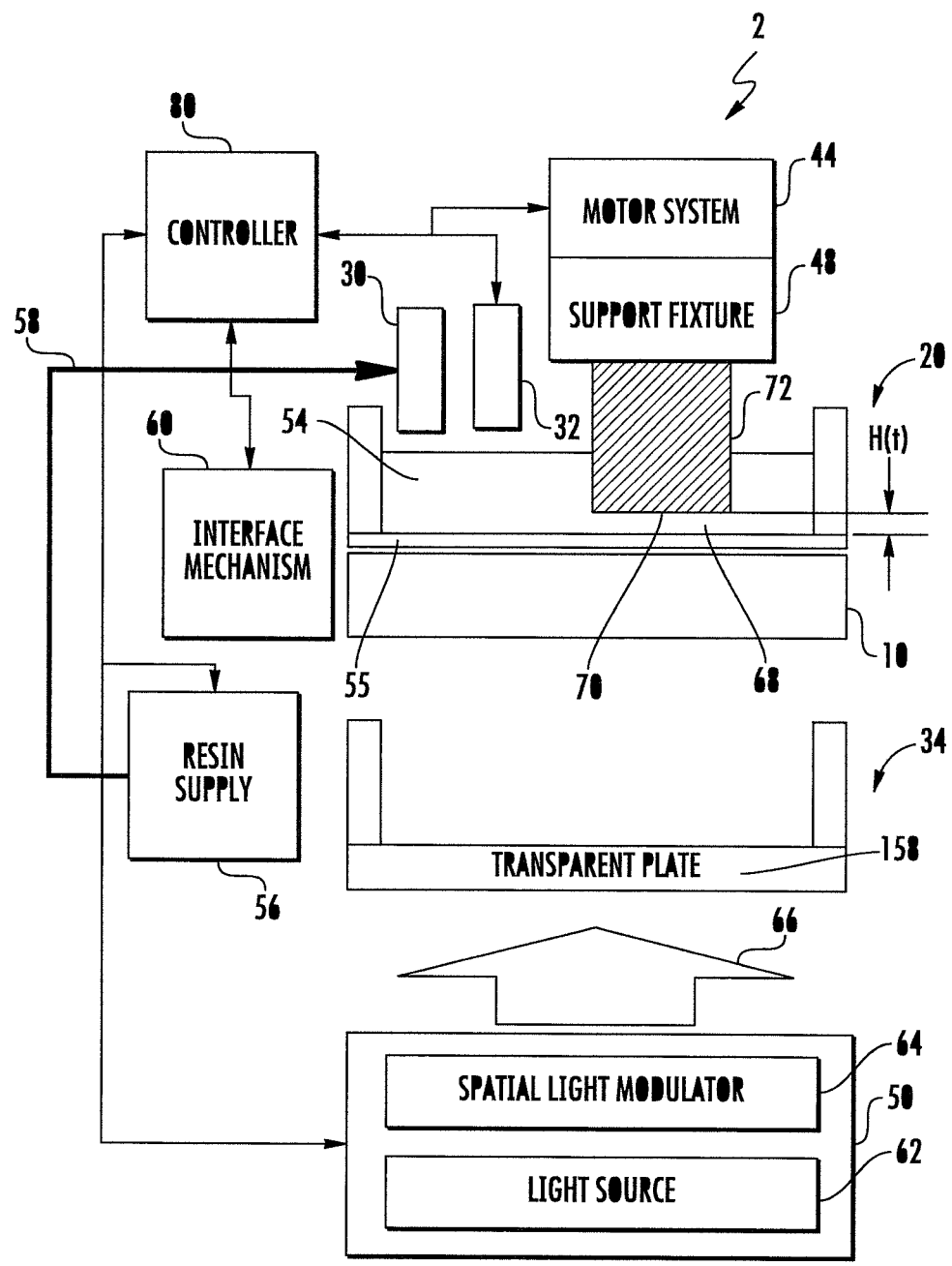
FIG. 2A is a schematic block diagram of an exemplary three dimensional printing system.

FIG. 2A is a block diagram schematic of the three dimensional printing system 2 including some mechanical features and a simplified electrical block diagram. The resin vessel 20 is shown containing resin 54. Resin vessel 20 includes a transparent sheet 55 which defines a lower bound for the resin 54 in vessel 20. The resin is being supplied from resin supply 56 and along a resin supply path 58 to the resin fluid outlet 30. An interface mechanism 60 is configured to controllably latch the resin vessel 20 to the support plate 10 and to position the resin fluid outlet 30 and the fluid level sensor 32 over the resin vessel 20.

Figure 2B:
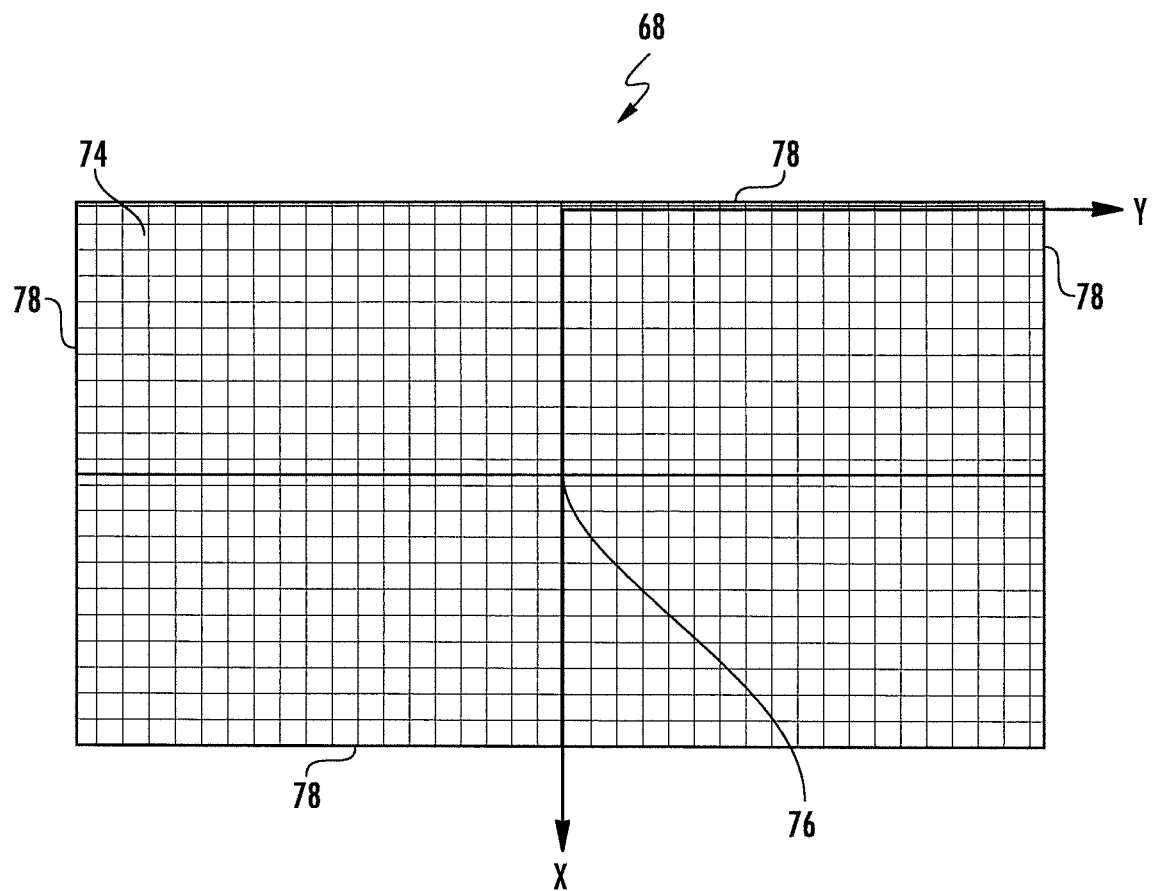
FIG. 2B is an illustration depicting a "build plane" which represents a thin slab of resin being selectively cured by a light engine.

The light engine 50 includes a light source 62 and a spatial light modulator 64. The light engine 50 projects pixelated light 66 up to a "build plane" 68 which is coincident with or proximate to a lower face 70 of a three dimensional article of manufacture 72 being fabricated. Build plane 68 is depicted in FIG. 2B as a two dimensional array of pixels 74. Each pixel 74 corresponds to a pixel element of the spatial light modulator 64.

Build plane 68 defines a lateral addressable extent of the light engine 50 within the resin vessel 20. The build plane 68 is actually a very thin slab or "slice" of resin with lateral dimensions in X and Y and a small vertical thickness. This slab of resin is selectively cured based upon a "slice" of data that is processed and sent to the spatial light modulator 64. The build plane 68 slab does not touch the transparent sheet 55 because an oxygen, chemical, or other inhibitor is utilized to block polymerization on an upper surface of transparent sheet 55. Each time a portion of the build plane 68 slab is selectively cured, it provides another accretive layer onto the lower face 70 of the three dimensional article of manufacture 72.

The thickness of resin between the lower face 70 and the transparent sheet 55 is important because it provides an optical path for the pixelated light 66. The weight of the resin 54 and other factors can cause the transparent sheet 55 to bulge between a center 76 and edges 78 of build plane 68. Such a bulge will result in variable curing and dimensional variations as a function of a distance from the center 76. To reduce this factor, a unique tensioning mechanism is provided to maintain flatness of the transparent sheet 55.

A controller 80 is controllably coupled to fluid level detector 32, motor system 44, light engine 50, resin supply 56, and interface mechanism 60. Controller 80 includes a processor (not shown) coupled to an information storage device (not shown). The information storage device includes a non-transient or non-volatile storage device that stores software instructions that, when executed by the controller 80, operate (and/or receive information from) fluid level detector 32, motor system 44, light engine 50, resin supply 56, interface mechanism 60, and other portions of three dimensional printing system 2. The controller 80 can be located on one circuit board or distributed among multiple circuit boards throughout the three dimensional printing system 2.

Figure 3A:
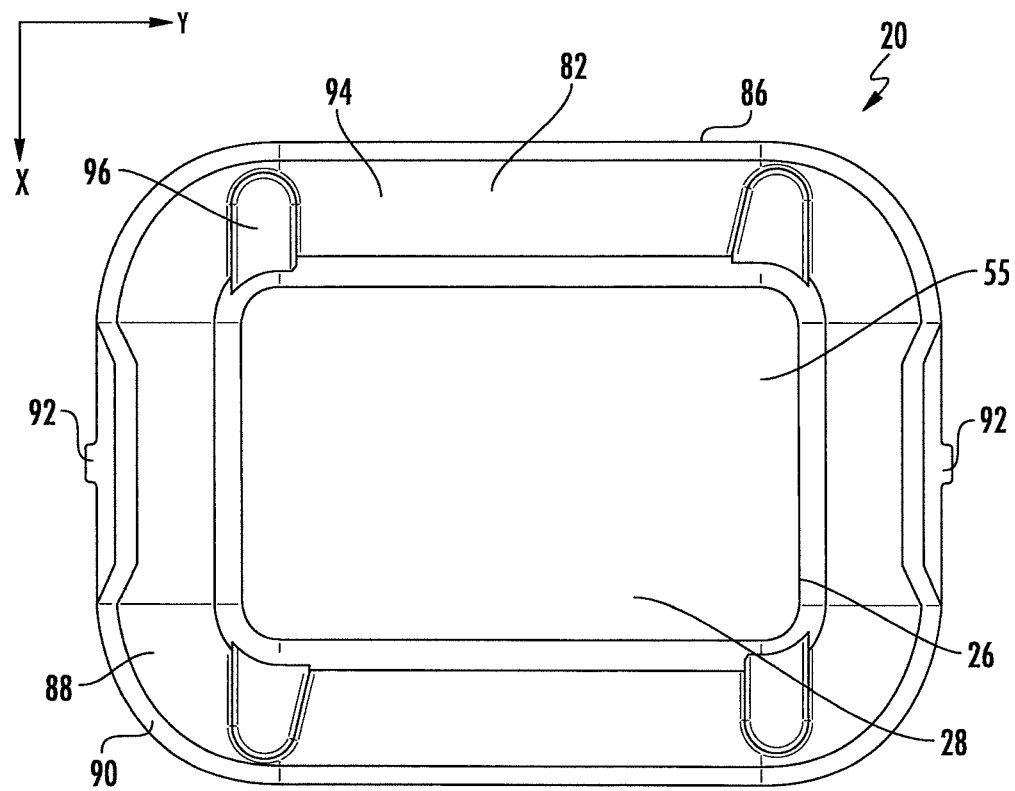
FIG. 3A is a top view of an exemplary resin vessel.
Figure 3B:
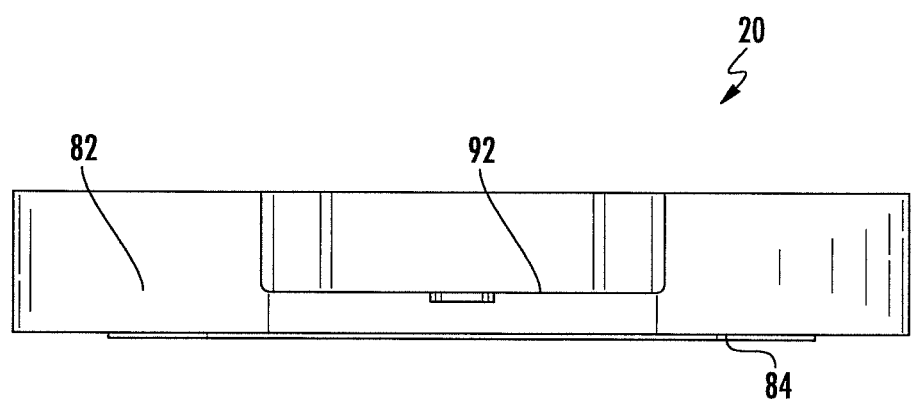
FIG. 3B is a side view of an exemplary resin vessel.
Figure 3C:
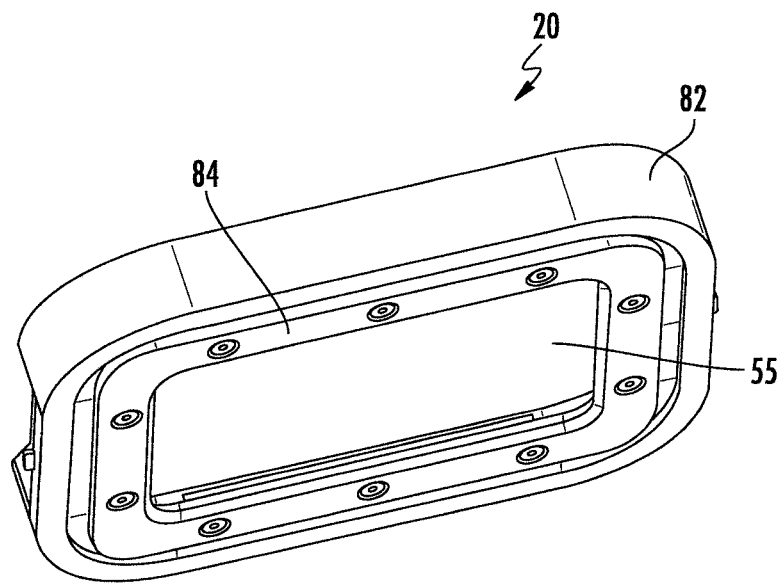
FIG. 3C is an isometric view of a lower side of an exemplary resin vessel.
Figure 3D:
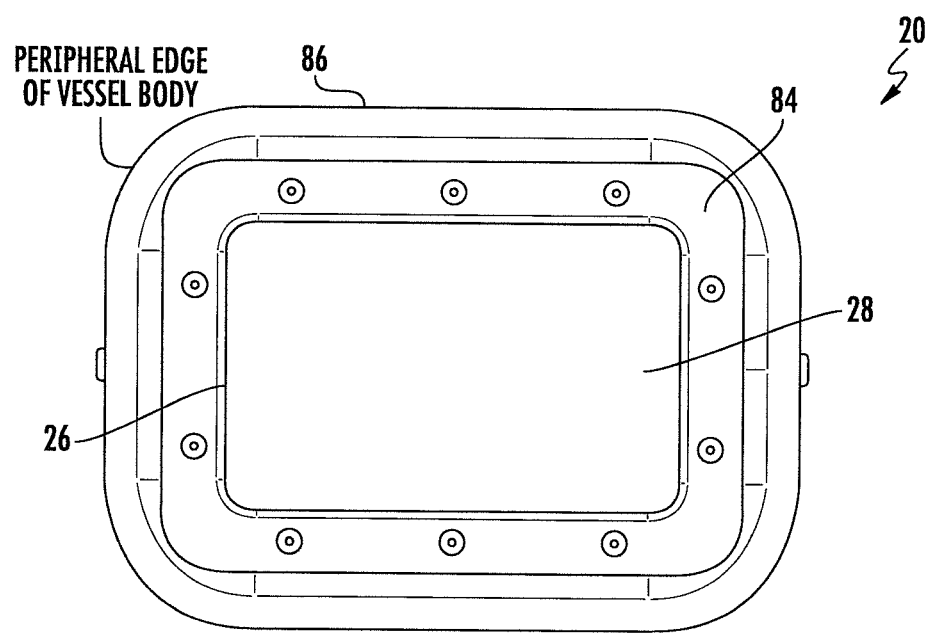
FIG. 3D is a bottom view of an exemplary resin vessel.

FIGS. 3A-D depict views of the resin vessel 20. FIG. 3A is a top view, FIG. 3B is a side view, FIG. 3C is an isometric view, and FIG. 3D is a bottom view of resin vessel 20. The construction of resin vessel 20 includes resin vessel body 82, transparent sheet 55, and retainer 84 that clamps the transparent sheet 55 to the resin vessel body 82.

The resin vessel body 82 has an outer peripheral edge 86 and inner edge 26. Inner edge 26 defines the central opening 28 that is closed on a lower side by the transparent film 55. Resin vessel body 82 includes a sloped surface 88 surrounded by a peripheral wall 90 partly defining the outer peripheral edge 86. Peripheral wall 90 helps to contain the resin 54 contained by the resin vessel 20. The sloped surface 88 allows resin to drain toward the central opening 28.

Resin vessel body 82 has a pair of opposing latch features 92 that are in opposing locations with respect to the lateral axis Y. Formed into the sloped surface 88 of the vessel body 82 is a channel 96 for receiving resin 54 from the resin fluid outlet 30.

Figure 4:
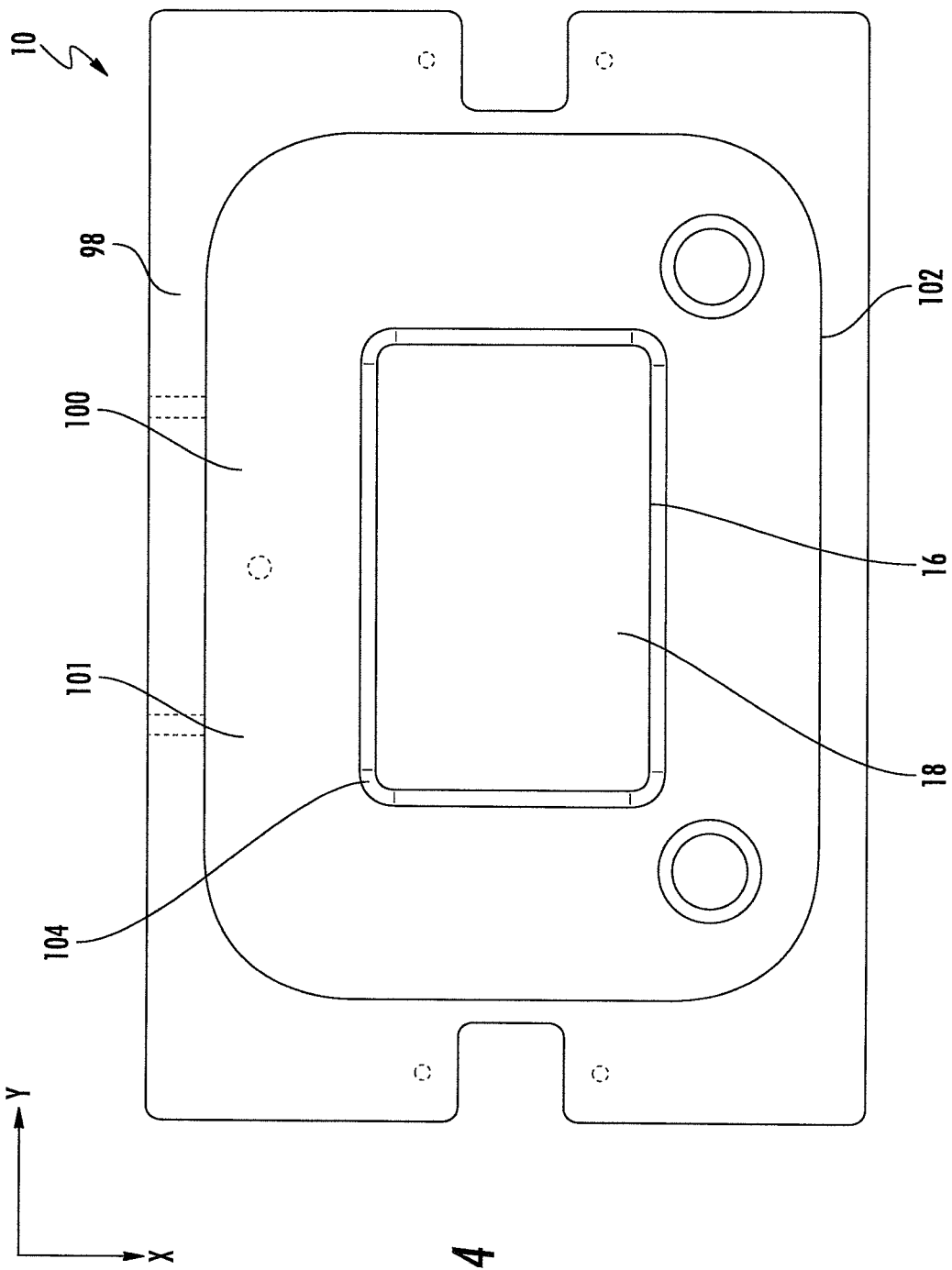
FIG. 4 is a top view of an exemplary support plate.

FIG. 4 is a top view depicting the support plate 10. Support plate 10 includes an upper surface 98 including a recessed surface 100 bounded by an inwardly facing wall 102. When the resin vessel 20 is loaded onto the upper surface 98 of support plate 10, a lower portion of resin vessel 20 is partially received into a recess 101 defined between the inwardly facing wall 102 and a raised ridge 104 that rises above the recessed surface 100. The resin vessel 20 is aligned to the support plate 10 by engagement between the outer peripheral edge 86 and the inwardly facing wall 102.

Extending above the recessed surface 100 is raised ridge 104. When the resin vessel 20 is loaded onto the support plate 10, the raised ridge 104 engages a lower surface of the transparent sheet 55, thereby laterally tensioning the transparent sheet 55. The engagement between the peripheral edge 86 and the inwardly facing wall 102 aligns the raised ridge 104 relative to the inner edge 26 of central opening 28 of resin vessel 20. Aligned, the raised ridge 104 is disposed at a substantially constant distance from the inner edge 26.

Simultaneously the central opening 28 of the resin vessel is aligned relative to the central opening 18 of the support plate 10. In the illustrated embodiment the raised ridge 104 defines at least part of the inwardly facing surface or edge 16 that bounds and defines the central opening 18.

Figure 5A:
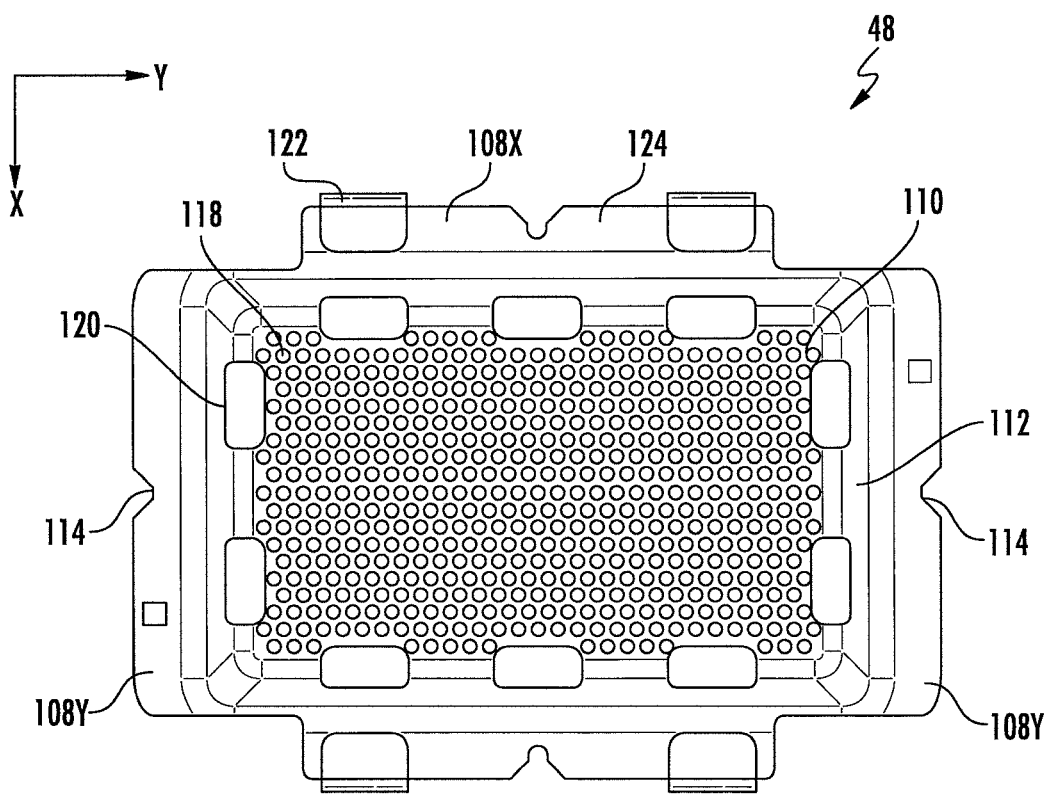
FIG. 5A is a top view of an exemplary support fixture.
Figure 5B:
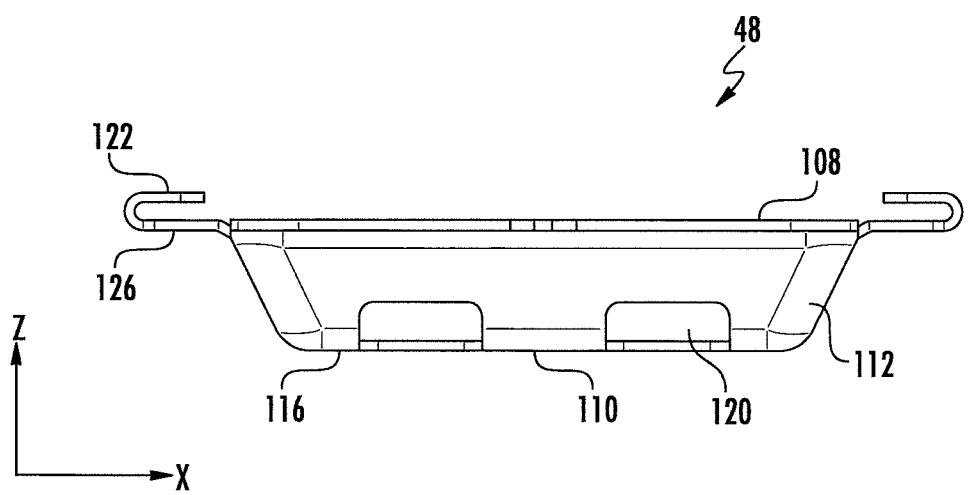
FIG. 5B is a side view of an exemplary support fixture.

FIGS. 5A and 5B depict support fixture 48. FIG. 5A is a top view and FIG. 5B is a side view. Support fixture 48 includes an upper portion 108, a lower planar portion 110, and a side wall 112 coupling the upper portion 108 to the lower planar portion 110.

The upper portion 108 includes portions 108X that extend along the lateral X axis and portions 108Y that extend along the lateral Y axis. The portions 108Y are for supporting the support fixture 48 between the receiving arms 46. Each 108Y portion includes a datum feature 114 for receiving and aligning to pins that extend upwardly from the receiving arms 46. The portions 108Y are also made of a magnetic material that is held down by magnets embedded in receiving arms 46. In an illustrative embodiment the entire support fixture 48 is formed from a magnetic material. When the support fixture 48 is being raised, the receiving arms 46 provide support in an upper direction because the receiving arms 46 press upwardly on the portions 108Y. When the support fixture is lowered whereby lower planar portion 110 is passing into resin 54, the magnetic interaction between the upper portion 108 and the receiving arms 46 provides a downward force that secures the support fixture 48 to the receiving arms 46.

The lower planar portion 110 has a lower surface 116 upon which the three dimensional article of manufacture 72 is formed. Formed into the lower planar portion 110 is a dense array of small openings 118. A primary purpose of the small openings 118 is to reduce a fluid drag just before and at the start of forming the three dimensional article of manufacture 72. Before forming the three dimensional article of manufacture 72, the lower surface 116 is moved through the resin 54 and very close to the transparent sheet 55. As the lower surface 116 approaches the transparent sheet 55, resin is displaced and must flow laterally from between the lower surface 116 and the transparent sheet 55. Without such openings 118 the force exerted on the transparent sheet 55 can be large enough to bulge or even damage the transparent sheet 55.

Figure 5C:
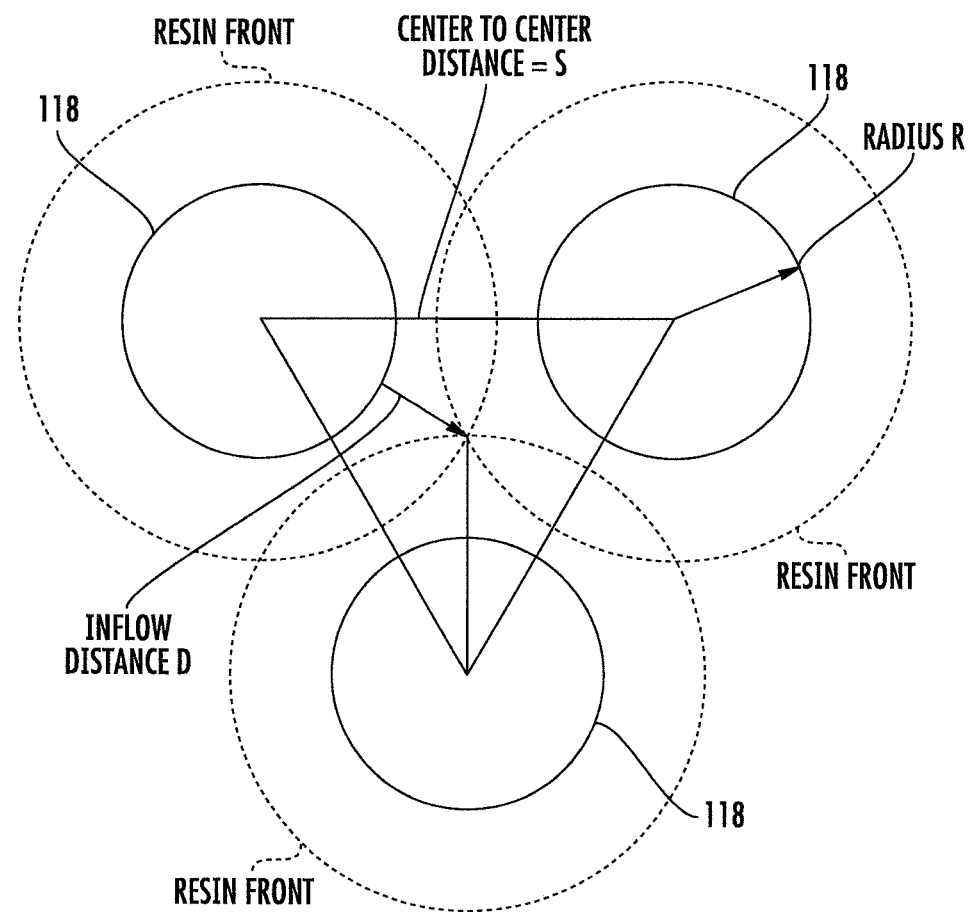
FIG. 5C is a diagram illustrating an "inflow distance" of resin flowing through openings in the support fixture.

The openings 118 allow the resin 54 to escape vertically through the lower planar portion 110 of the support fixture 48. But there is still a vertical force being exerted upon the transparent sheet 55. This vertical force varies positively with an "inflow distance" D. FIG. 5C illustrates the inflow distance D between three small openings 118. The inflow distance D is a geometric parameter that varies monotonically with a vertical force that is indirectly exerted between the lower surface 116 and the transparent sheet 55 by the thin layer of resin 54 therebetween.

The inflow distance 120 is geometrically defined as the distance that resin must flow out of an opening 118 between the transparent sheet 55 and the lower surface 116 before the entire lower surface 116 is covered with resin. This occurs when the dashed circles representing a "resin front" flowing out of the circles close all uncovered gaps. This therefore occurs when the resin fronts intersect at a midpoint between the arrangement of the three openings 118.

Defining some terms: S=the center to center distance between the openings along Y. R=opening radius. D=the inflow distance between an edge of the opening and the midpoint between the openings. Using geometry, the result is that D=S/√3−R for this arrangement of openings.

For a particular example, the center to center distance S is 4.5 millimeters. The opening radius R is 1.5 millimeters. Then the inflow distance D is about 1.1 millimeters (rounding to the first significant figure).

Preferably the dense array of small openings 118 cover the entire area of the build plane 68 in order to minimize a vertical force exerted on the transparent sheet 55. In one embodiment the dense array of small openings 118 includes at least 100 small openings 118. In another embodiment the dense array of small openings 118 includes at least 200 small openings 118.

In some embodiments the inflow distance is less than 3 millimeters. In other embodiments the inflow distance is less than 2 millimeters. In yet other embodiments the inflow distance is less than 1.5 millimeters.

The small openings 118 are the primary feature in reducing fluid drag and force on the transparent sheet 55 just before and at the beginning of forming the three dimensional article of manufacture 72 (and/or when lower surface 116 is moving vertically through resin proximate to the upper surface of the transparent sheet 55). As the three dimensional article of manufacture 72 is being formed, the distance between the lower surface 116 and the transparent sheet 55 increases and the effect of the openings 118 decreases.

Formed along the side wall 112 are a plurality of large openings 120. The large openings 120 reduce the fluid drag of the resin 54 as the lower planar portion 110 of the support fixture 48 is being raised or lowered in the resin 54. During fabrication of a three dimensional article of manufacture 72 the large openings 120 become a greater factor than the smaller openings 118 in reducing fluid drag when a sufficient portion of the three dimensional article of manufacture 72 is formed. The large openings 120 also provide the function of allowing residual resin 54 to drain from the support fixture 48 when the lower planar support portion 110 is lifted out of the resin 54 in resin vessel 20.

The large openings 120 reduce a fluid pressure difference between the resin 54 inside the side wall 112 of the support fixture 48 and outside the side wall 112 as the lower planar portion is being raised and lowered within the resin 54. As the lower planar portion 110 is being lowered into the resin 54, the large openings 120 allow resin to flow into the space above the lower planar portion 112. As the lower planar portion 110 is being raised, the large openings allow the resin to flow out of the space above the lower planar portion 112.

According to the illustrated embodiment the large openings 120 are distributed to surround the dense array of small openings 118. The large openings are at least partially formed into the side wall 112. In some embodiments, individual large openings 120 span the side wall 112 and an edge of the lower support portion 110. In one embodiment a large opening 120 has a cross sectional area equal to at least a plurality of the cross sectional area of one small opening 118. In another embodiment the large opening 120 has a cross sectional area equal to at least five times the cross sectional area of one small opening 118. In another embodiment the large opening 120 has a cross sectional area equal to at least ten times the cross sectional area of one small opening 118.

The side wall 112 is preferably angled relative to vertical axis Z to enable a nested stacking of the support fixtures 48. This enables a stack of support fixtures 48 to be loaded into a magazine for automated loading into a printing system 2. In one embodiment the angle of the side wall 112 relative to the vertical axis Z is in a range of 10 to 50 degrees. In another embodiment the angle of the side wall 112 relative to the vertical axis Z is in a range of 20 to 40 degrees. In yet another embodiment the angle of the side wall 112 relative to the vertical axis Z is in a range of 25 to 35 degrees. In a further embodiment the angle of the side wall 112 relative to the vertical axis Z is about 30 degrees. There is a tradeoff in the angle. As the angle increases, a required area of the support fixture 48 and resin vessel 20 increases for a given area of a build plane 68. Thus, a minimal angle may seem optimized. However as the angle decreases, vertical stacking efficiency of the support fixtures 48 decreases. Therefore an angle of about 30 degrees from vertical is roughly an optimal tradeoff for vertical stacking efficiency versus size.

The portions 108X of the upper portion 108 that extend along the X axis include a plurality of bent tabs 122 that extend above an upper planar surface 124 of the portions 108X. The bent tabs 122 are for engaging a lower planar surface 126 of the portions 108X to provide a controlled vertical spacing between stacked support fixtures 48. In the illustrative embodiment an individual bent tab 122 is bent into a U-shape whereby an end of the tab 122 faces inwardly.

Figure 6:
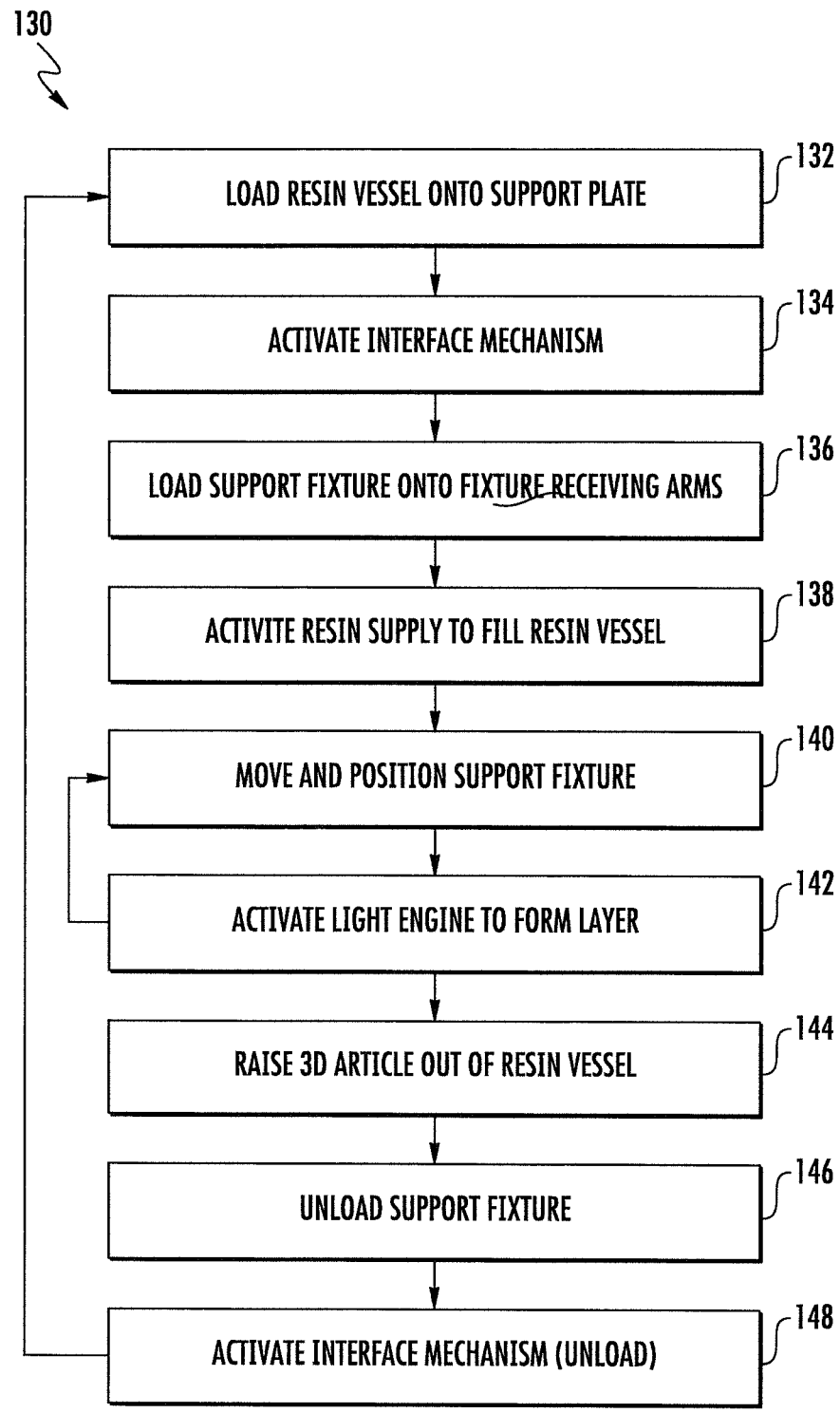
FIG. 6 is a flowchart depicting an exemplary method of manufacturing a three dimensional article of manufacture.

FIG. 6 is a flowchart representing a manufacturing method 130 for using printing system 2 to fabricate a three dimensional article of manufacture 72. Some individual steps of method 130 will also be described and/or illustrated with respect to subsequent figures in added detail. Also, some of the earlier figures pertain to method 130. Most or all of the steps of method 130 can be under control of the controller 80. For steps 132, 136, and 146 any or all of these can be performed either manually or with a robotic arm under control of the controller 80. Remaining steps 134, 138-144, and 148 can be controlled by the controller 80.

According to step 132, the resin vessel 20 is loaded onto support plate 10. According to step 134, the interface mechanism 60 is activated to secure the resin vessel 20 to the support plate 10 and to position the resin fluid outlet 30 and the fluid level sensor 32 over the resin vessel 20. According to step 136, the support fixture 48 is loaded onto the fixture receiving arms 46. In some embodiments step 136 is performed before step 134 and/or before step 132.

According to step 138, the resin supply 56 is activated whereby the resin supply 56 supplies resin to the resin vessel 20. According to this step the controller 80 utilizes the fluid level sensor 32 to monitor a fluid level of the resin 54 in the resin vessel 20. The controller 80 activates the resin supply 56 to pump resin 54 through the supply path 58 and out the resin fluid outlet 30 until a proper level of resin 54 is present in resin vessel 20. During subsequent steps, the controller 80 can continue to monitor information from the fluid level sensor 32 and operate the resin supply 56 to maintain a proper level of resin in the resin vessel 20.

According to step 140, the motor system 44 operates the lead screw 42 to translate the carriage 40 whereby the lower surface 116 of support fixture 46 is positioned at an operating distance from the transparent sheet 55. According to step 142, the light engine 50 is activated to selectively polymerize a layer of the resin onto the lower surface 116. Steps 140 and 142 are repeated until the entire three dimensional article of manufacture 72 is formed. As a note, when step 140 is repeated, it is the lower face 70 of the three dimensional article of manufacture 72 that is positioned at the operating distance from the transparent sheet 55.

According to step 144, the motor system 44 is operated to raise the three dimensional article of manufacture 72 out of the resin 54. According to step 146 the support fixture 48 is unloaded from the receiving arms 46. According to step 148, the interface mechanism 60 is operated to move the resin fluid outlet 30 and the fluid level sensor 32 from above the resin vessel 20. Also according to step 148 the resin vessel 20 is unlatched so that it can be removed from the support plate 10.

As a note various alternative embodiments are possible. For example, step 148 can be skipped and the process can proceed to step 136 whereby another support fixture 48 is loaded for forming another three dimensional article of manufacture 72 with the same resin vessel 20. Thus, the depicted method 130 is illustrative and lends itself to certain variations.

Figure 7A:
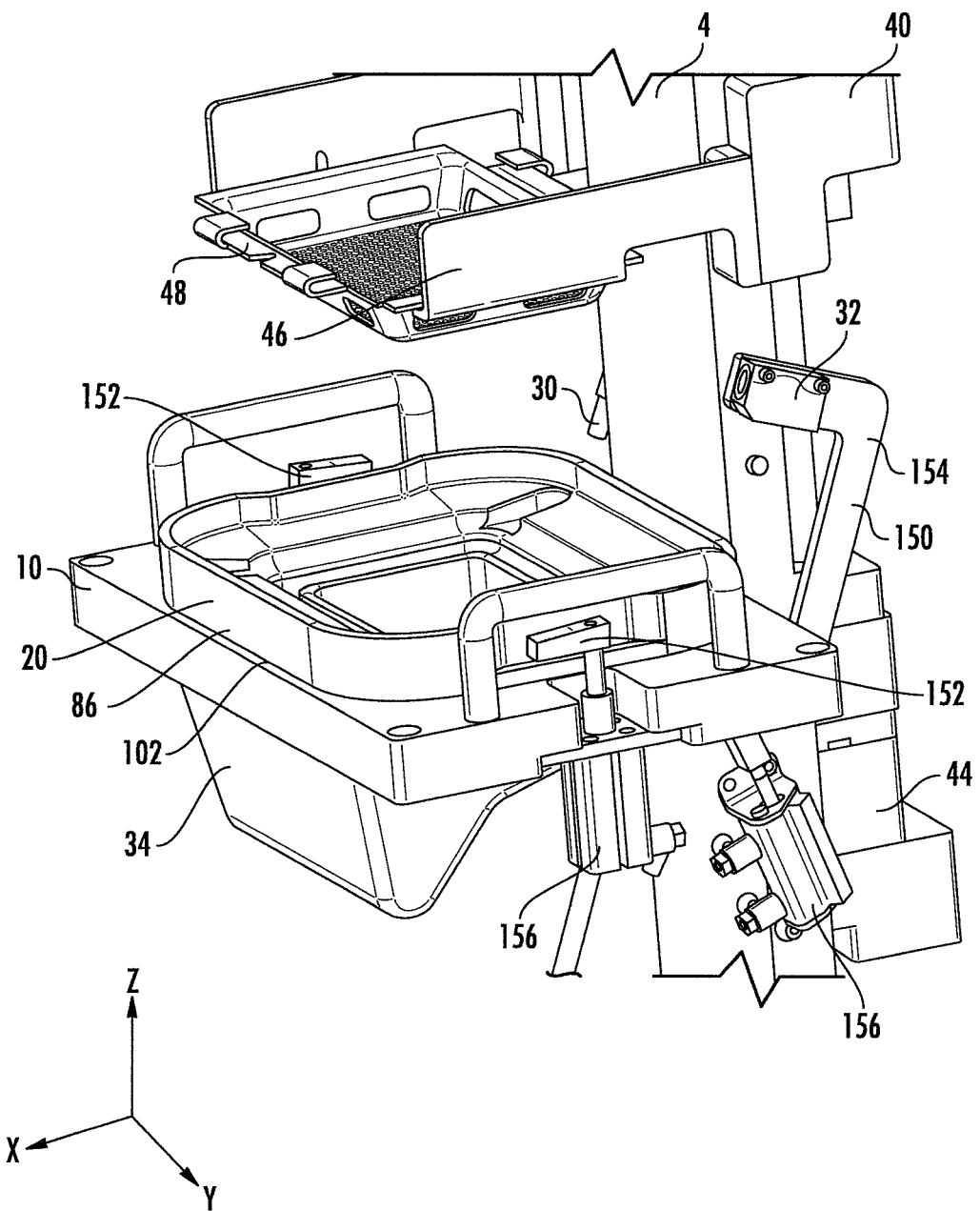
FIG. 7A is an isometric drawing depicting loading a resin vessel onto a support plate with an interface mechanism in a non-operating state.

FIGS. 7A-D are isometric views depicting loading and securing the resin vessel 20 and the fluid spill containment vessel 34 to the support plate 10. FIG. 7A depicts step 132 of FIG. 6. The resin vessel 20 has been loaded onto the support plate 10. A lower portion of resin vessel 20 has been received into the recess 101 (see also FIG. 4). Engagement of the peripheral edge 86 and the inwardly facing wall 102 has provided lateral (X and Y) alignment of the resin vessel 20 with respect to the support plate 10.

Also shown in FIG. 7A is a resin handling module 150 that supports both the resin fluid outlet 30 and the fluid level sensor 32 with arms 154. The resin handling module 150 is configured to rotate about an axis parallel to lateral axis Y. In FIG. 7A the resin handling module 150 is shown in a non-operating position whereby the resin fluid outlet 30 and the fluid level sensor 32 are not in position over the resin vessel 20. Latches 152 are also shown in a non-engaged position.

Figure 7B:
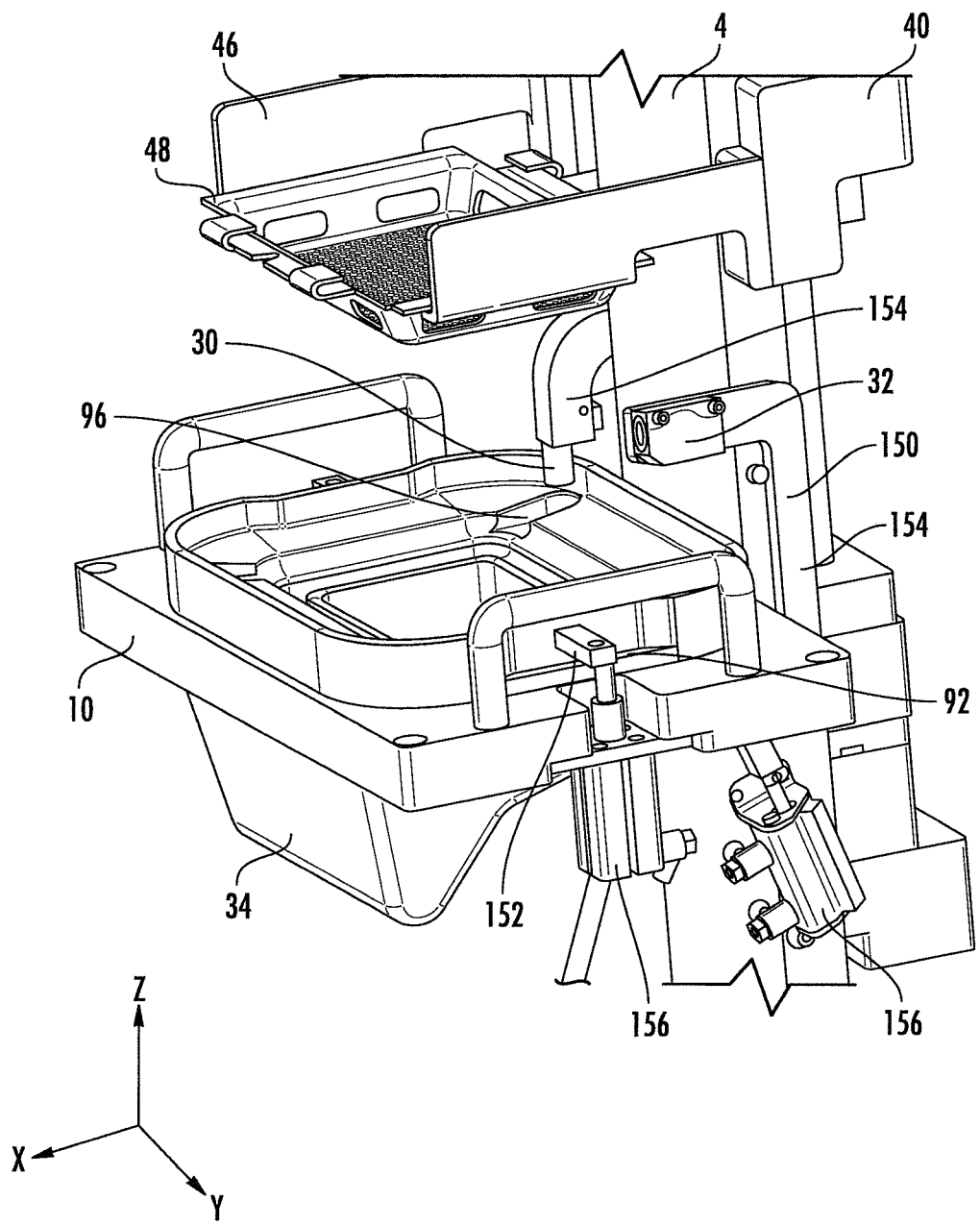
FIG. 7B is an isometric drawing depicting loading a resin vessel onto a support plate with an interface mechanism in an operating state.

FIG. 7B depicts step 134 of FIG. 6. Between FIGS. 7A and 7B the resin handling module 150 has been rotated about an axis parallel to lateral axis Y from a non-operating position (FIG. 7A) to an operating position (FIG. 7B). In the operating position the resin fluid outlet 30 and the fluid level sensor 32 are both positioned over the resin vessel 20. Also the latches 152 are engaged with latch features 92 at opposing ends of the resin vessel. The latches 152 exert a downward (−Z) vertical force on the latch features 92 to increase a tension in the transparent sheet 55.

The resin handing module 150 includes two arms 154 that are linked together whereby they rotate together in unison between the non-operating position and the operating position of the resin handling module 150. The interface mechanism 60 that actuates the resin handling module 150 and the latches 152 is configured to simultaneously actuate them to move them back and forth between a non-operating state (non-operating position of resin handling module 150 and latches 152 not engaged) to an operating state (operating position of resin handling module 150 and latches 152 engaged).

Figure 7C:
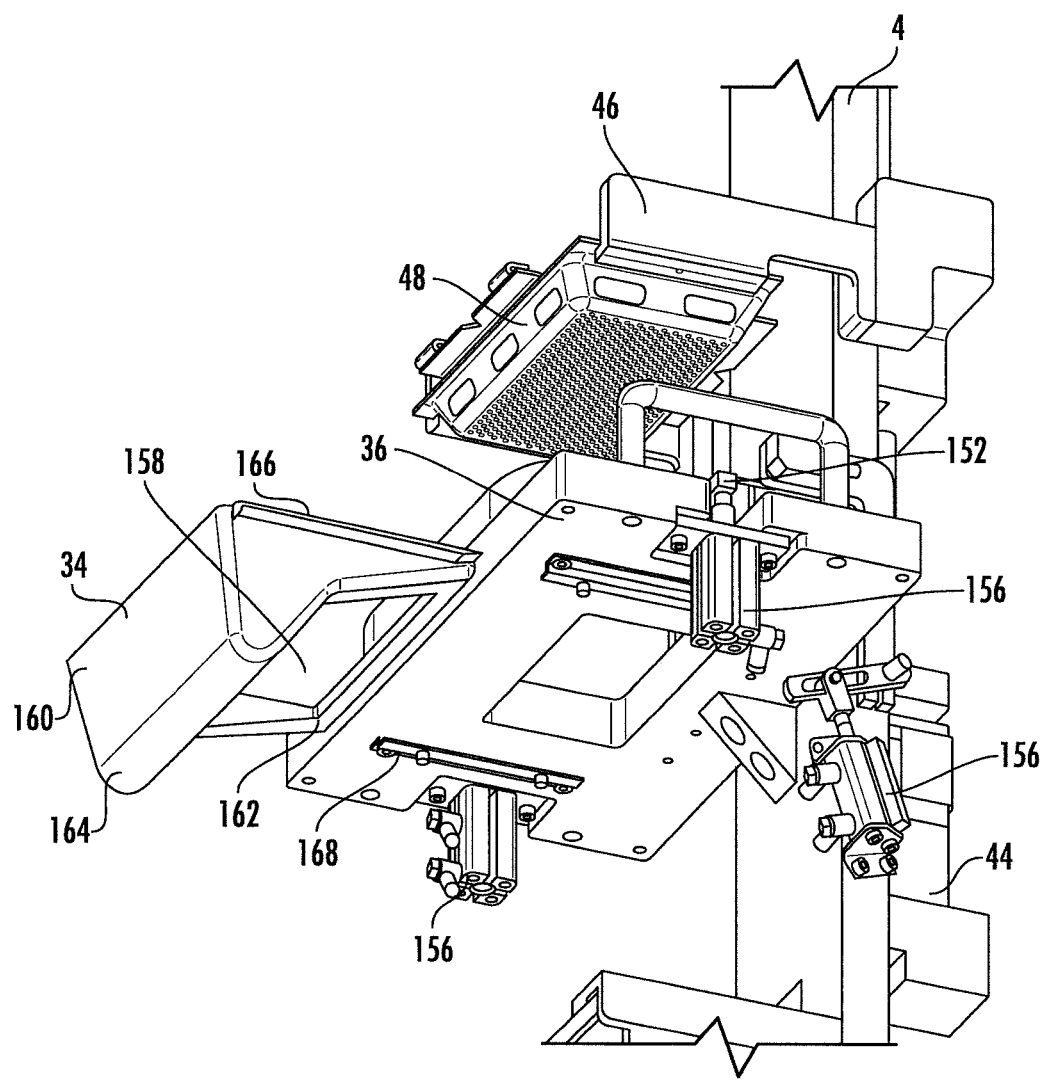
FIG. 7C is an isometric drawing depicting a fluid spill containment vessel about to be loaded onto a lower side of a support plate.

In the illustrative embodiment, the interface mechanism 60 includes pneumatic actuators 156. FIG. 7C depicts a more complete view of the pneumatic actuators 156 (shown without air "plumbing"). There is a pneumatic actuator 156 coupled to each latch 152 and a pneumatic actuator 156 coupled to the resin handling module 150. The air pressure applied to the pneumatic actuators 156 enables motion of the resin handling module 150 and latches 152 to be simultaneous.

The resin vessel 20 is unloaded in reverse order of being loaded. This includes (1) changing the interface mechanism 60 from an operating to a non-operating state—going from FIG. 7B to FIG. 7A, and then (2) unloading the resin vessel 20 from the support plate 10.

Figure 7D:
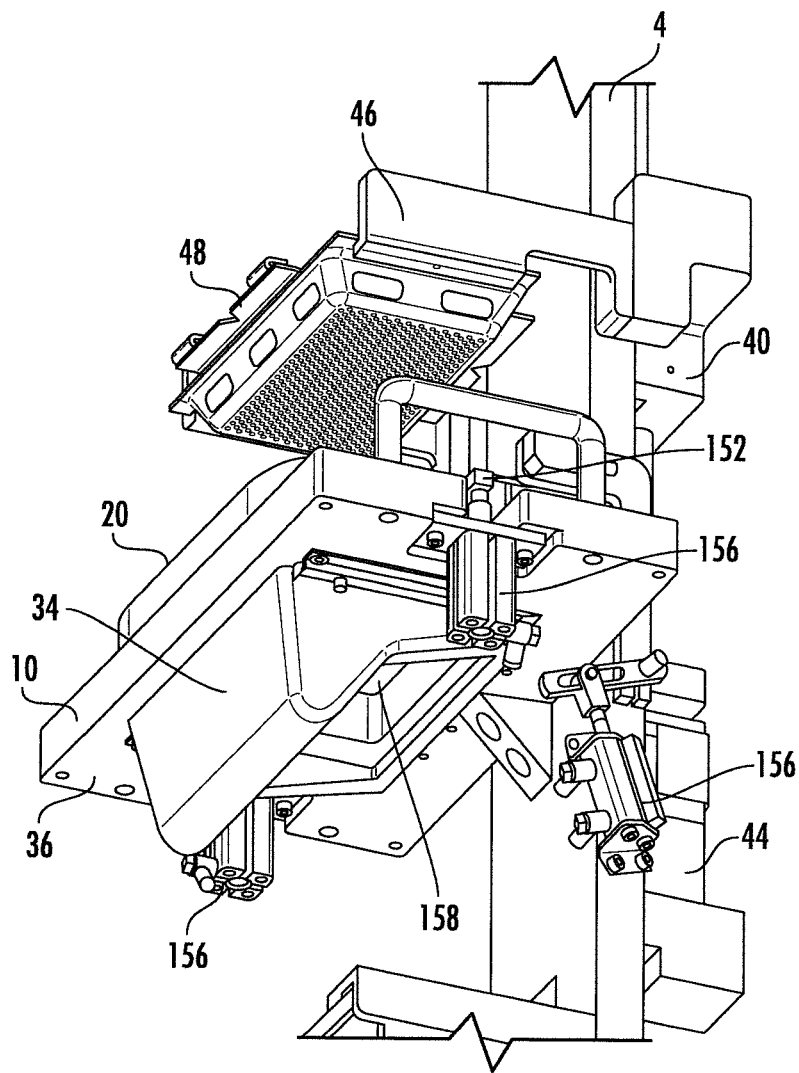
FIG. 7D is an isometric drawing depicting a fluid spill containment vessel loaded onto a lower side of a support plate.

FIGS. 7C and 7D depict the fluid spill containment vessel 34 being slidingly mounted to the lower side 36 of the support plate 10. The fluid spill containment vessel 34 includes a transparent window 158 for allowing light to pass from the light engine 50 to the resin vessel 20. The fluid spill containment vessel 34 has a generally tapering profile from a distal end 160 to a proximal end 162. The tapering profile provides an internal slope whereby resin can drain away from the transparent window 158 and into a trough 164. This minimizes a tendency for a light path from the light engine 50 to the build plane 68 to be occluded by spilled resin that has accumulated in the fluid spill containment vessel 34.

The fluid spill containment vessel 34 has a pair of opposing upper lips 166 that extend outwardly along the lateral Y axis. Mounted to the lower side 36 of support plate 10 are two rails 168 that are aligned with lateral axis X and spaced apart with respect to lateral axis Y. The fluid spill containment vessel 34 is mounted to the support plate 10 by slidingly engaging the rails 168 with the upper lips 166 along the lateral axis Y.

FIGS. 7C and 7D depict disengaged and engaged positions respectively of the fluid spill containment vessel 34 with respect to the support plate 10. In the engaged state, the resin vessel central opening 28, the support plate central opening 18, and the fluid spill containment vessel 34 transparent window 158 are all aligned whereby the light engine 50 can project pixelated light up through them and to the build plane 68.

Figure 8A:
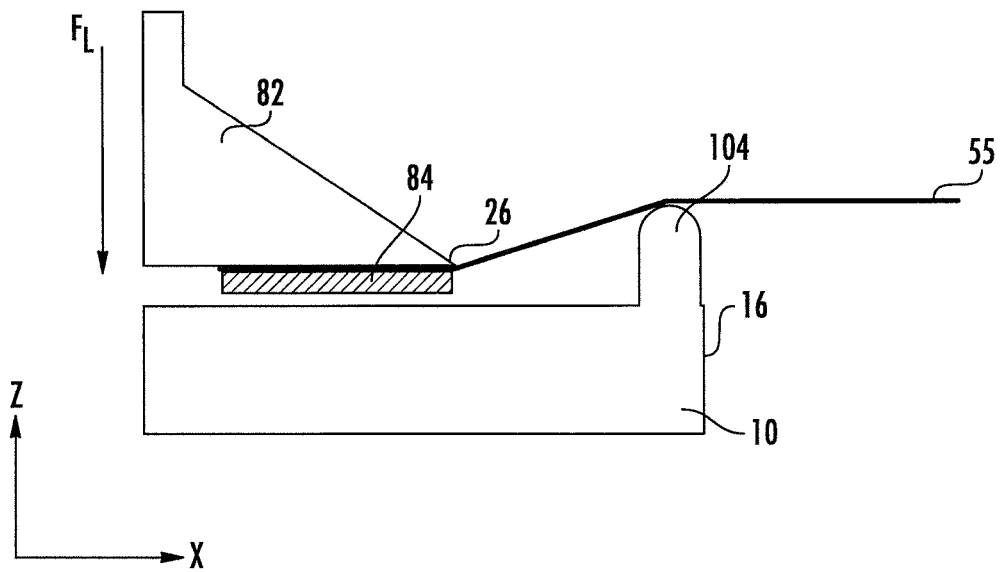
FIG. 8A is a simplified cross sectional schematic illustration of tensioning of a transparent sheet.

FIG. 8A is a cross sectional view depicting interaction of components involved in tensioning the transparent sheet 55 during steps 132 and 134 of FIG. 6. When the resin vessel 20 is loaded onto the support plate 10, the raised ridge 104 engages the transparent sheet 55. When the latches 152 engage the latch features 92, they exert a combined downward latch force $F_L$ upon the resin vessel. This has the effect of tensioning the transparent sheet 55. The tension in the transparent sheet 55 can be controlled by controlling the latch force $F_L$.

Figure 8B:
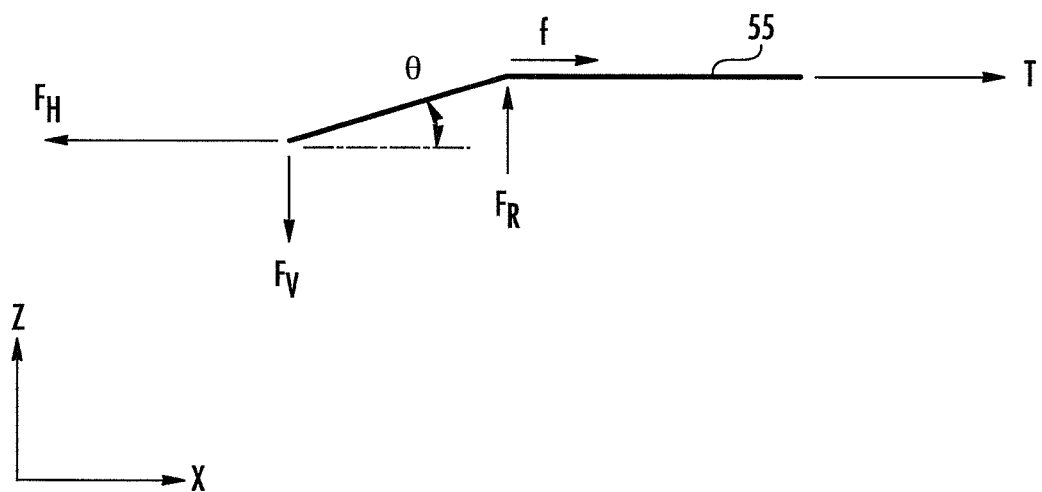
FIG. 8B is a simplified diagram of force exerted on the transparent sheet of FIG. 8A.

FIG. 8B depicts the forces involved: T=Tension in Transparent Sheet 55, $F_H$=Horizontal Force Exerted on Transparent Sheet by Vessel Body 82, f=horizontal frictional force exerted on transparent sheet 55 by raised ridge 104, $F_V$=vertical force exerted on transparent sheet 55 by Vessel Body 82, and $F_R$=Vertical Force Exerted by Raised Ridge 104 on Transparent Sheet 55. Now, $F_V = W_V + F_L$, where $W_V$ is the weight of the resin vessel 20 and $F_L$ is the downward force of both latches. These forces are known.

Summing the forces in X: $T+f=F_H$. Summing the forces in Y: $F_V=F_R$. From geometry the tangent of θ equals $F_V$ divided by $F_H$. From the above relationships, and from computing the frictional force f based a coefficient of friction and $F_R$, the tension T can be approximated in terms of known variables. This diagram is a simplified approximation of the actual system because it is in two dimensions and the actual system would consider the sheet in three dimensions. If the angle θ is small, then the tension T can be quite large relative to the vertical forces applied. There may be a need to increase the vertical force over time to compensate for an increase in angle θ if the transparent sheet 55 stretches. The configuration of FIG. 8A has an advantage that the latch force $F_L$ can be programmably controlled by the controller 80 controlling the air pressure applied to pneumatic actuators 156. Thus, the tension T can be indirectly programmably controlled by the controller 80.

Figure 8C:
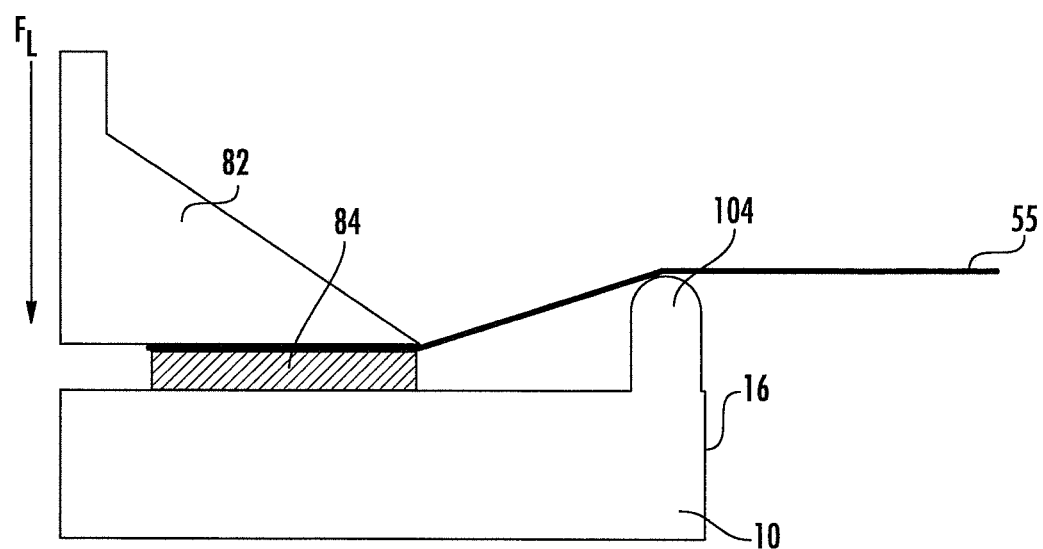
FIG. 8C is a simplified cross sectional schematic illustration of an alternative method of tensioning a transparent sheet.

FIG. 8C illustrates an alternative embodiment in which the resin vessel 20 "bottoms out" on the support plate 10. With this embodiment, the tension T in the transparent sheet 55 is governed by a vertical position of the vessel body 82 in relation to the raised ridge 104. In this embodiment, any compression set in the transparent sheet 55 will reduce the tension T. While this embodiment is viable, it would be less desirable than the embodiment of FIG. 8A if the transparent sheet 55 stretches over time and/or if dimensional tolerances are not precisely controlled.

Figure 9:
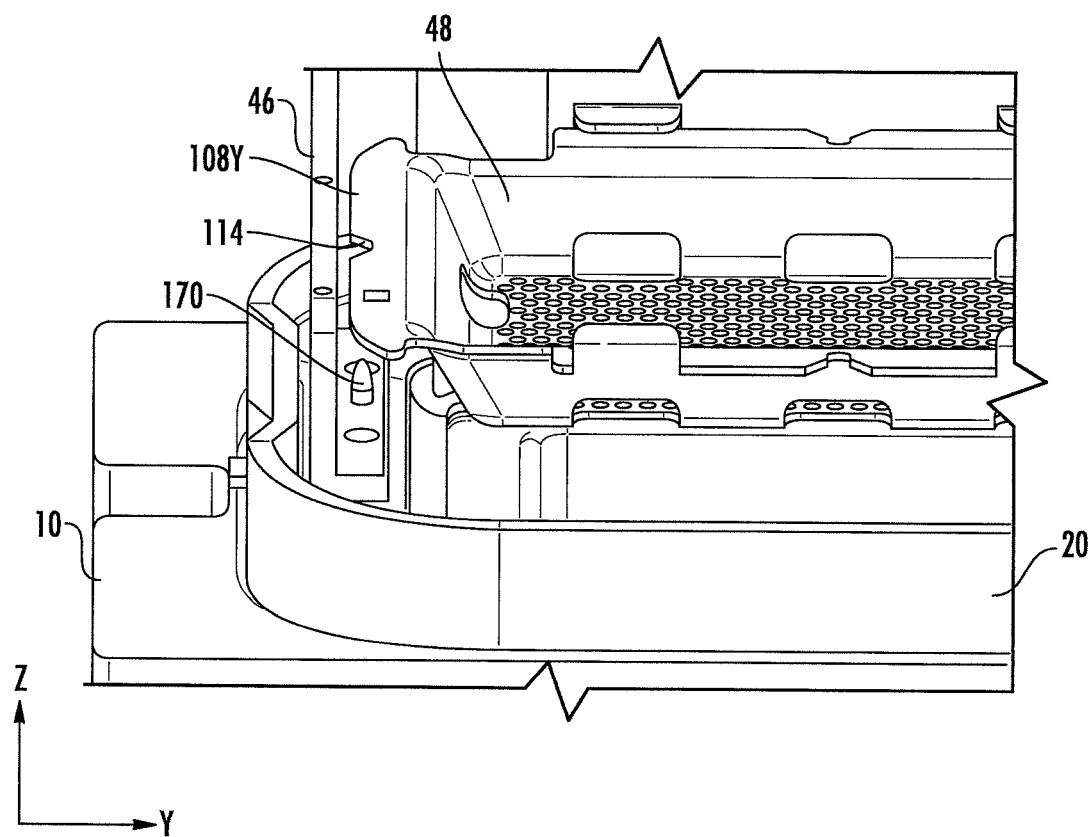
FIG. 9 is an isometric drawing depicting loading a support fixture onto a receiving arm.

FIG. 9 depicts a mechanical interaction between the portion 108Y of the support fixture 48 and receiving arm 46 as the support fixture is loaded according to step 136 of FIG. 6. The receiving arm 46 includes upstanding pin 170 that is received by datum feature 114 for providing lateral alignment of the support fixture 48. Between both support arms the lateral alignment provided includes X, Y, and rotation about the axis Z. The portion 108Y is formed from a magnetic material and receiving arm contains a magnet. The magnetic interaction and mechanical interaction along the vertical axis Z between portions 108Y and the receiving arms provide support along the vertical axis Z and against rotation about the horizontal axes.

Figure 10:
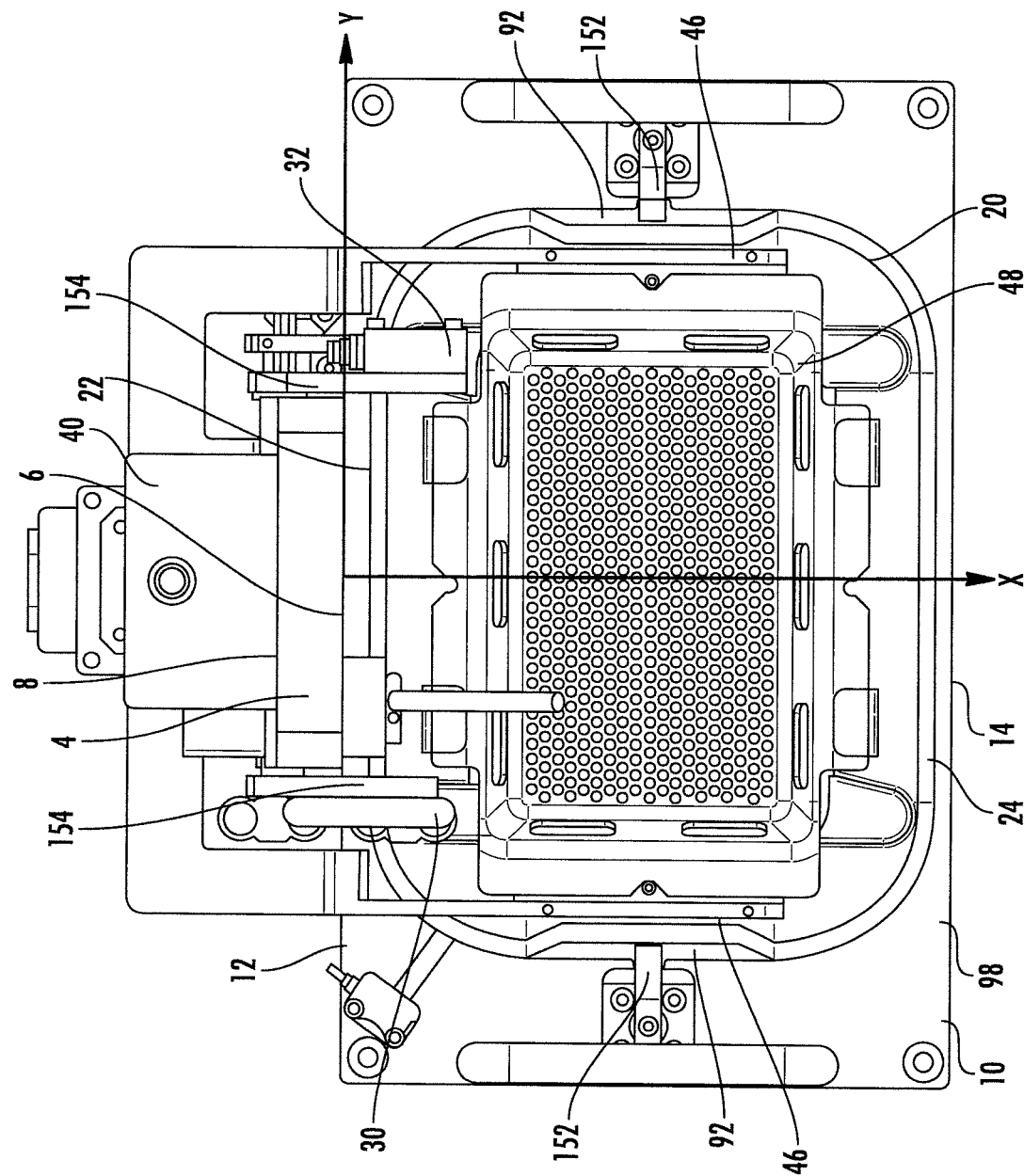
FIG. 10 is a top view of a portion of an exemplary three dimensional printing system with a resin vessel and support fixture installed.

FIG. 10 is a top view of an embodiment of three dimensional printing system 2 with the resin vessel 20 and the support fixture 48 installed. The vertical support 4 has a front side 6 and a back side 8. Extending from the front side 6 is the support plate 10. The support plate 10 extends along lateral axis X from a proximal end 12 (proximate to the front side 6) to a distal end 14.

Resin vessel 20 is disposed above a portion of the upper surface 98 of support plate 10 (held above a recessed portion 100 of the upper surface by the force of the raised ridge 104 upon the transparent sheet 55). The resin vessel 20 has a rear portion 22 that is laterally proximate to the proximal end 12 of the support plate. The resin vessel 20 has a front portion 24 that is laterally proximate to the distal end 14 of the support plate. The resin vessel 20 has a pair of opposed latch features 92 including left and right latch features 92 at opposed ends with respect to the lateral axis Y. Corresponding to the left and right latch features 92 are left and right latches 152.

The interface mechanism 60 (depicted in block diagram form in FIG. 2A) is activated whereby the resin handling module 150 and latches 152 are in an operating state. In the operating state the resin handling module 150 is in an operating position whereby the resin fluid outlet 30 and the fluid level sensor 32 are positioned over the resin vessel 20 and the latches 152 are engaged with the latch features 92 of resin vessel 20. The resin fluid outlet 30 and the fluid level sensor 32 are disposed over the rear portion 22 of the resin vessel 20. The resin fluid outlet 30 and the fluid level sensor 32 are also spaced apart and on either side of the vertical support 4 with respect to the lateral axis Y and each are supported by an arm 154 of the resin handing module 150.

Extending from the back side 8 of vertical support 4 is carriage 40. Extending forwardly (+X) along lateral axis X from carriage 40 are the receiving arms 46. The receiving arms 46 are spaced apart along the lateral axis Y to an extent that the arms 154 are between the receiving arms 46. Installed between receiving arms 46 is the support fixture 48 that spans a space between the receiving arms 46 along the lateral axis Y.

Figure 11:
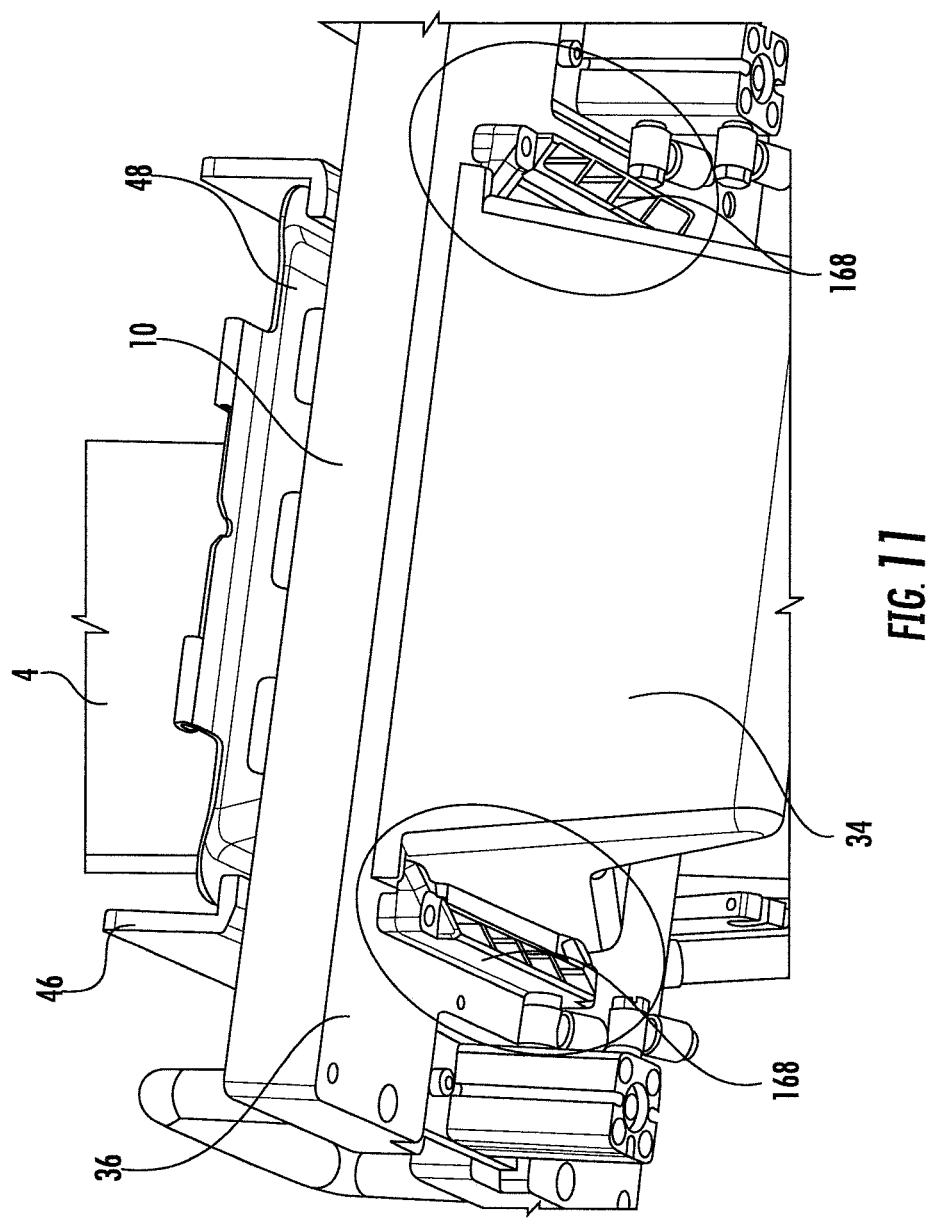
FIG. 11 is an isometric drawing illustrating an improved design for securing a fluid spill containment vessel to a three dimensional printing system.

FIG. 11 depicts an alternative embodiment for the rails 168. The rails 168 depicted in FIGS. 7C and 7D are formed from extruded or bent sheet metal. In contrast, the rails 168 depicted in FIG. 11 are formed by injection molding. This allows for added features to enhance the ergonomics of engaging the opposing upper lips 166 with the rails 168.

While previous figures depict the fluid spill containment vessel 34 as mounted directly to the lower side 36 of support plate 10, other arrangements are possible. In an alternative embodiment, the fluid spill containment vessel 34 can be directly coupled to the vertical support 4. In yet another alternative, vertical support can have a pair of support brackets extending therefrom. The fluid spill containment vessel 34 can be mounted to the brackets.

Figure 12:
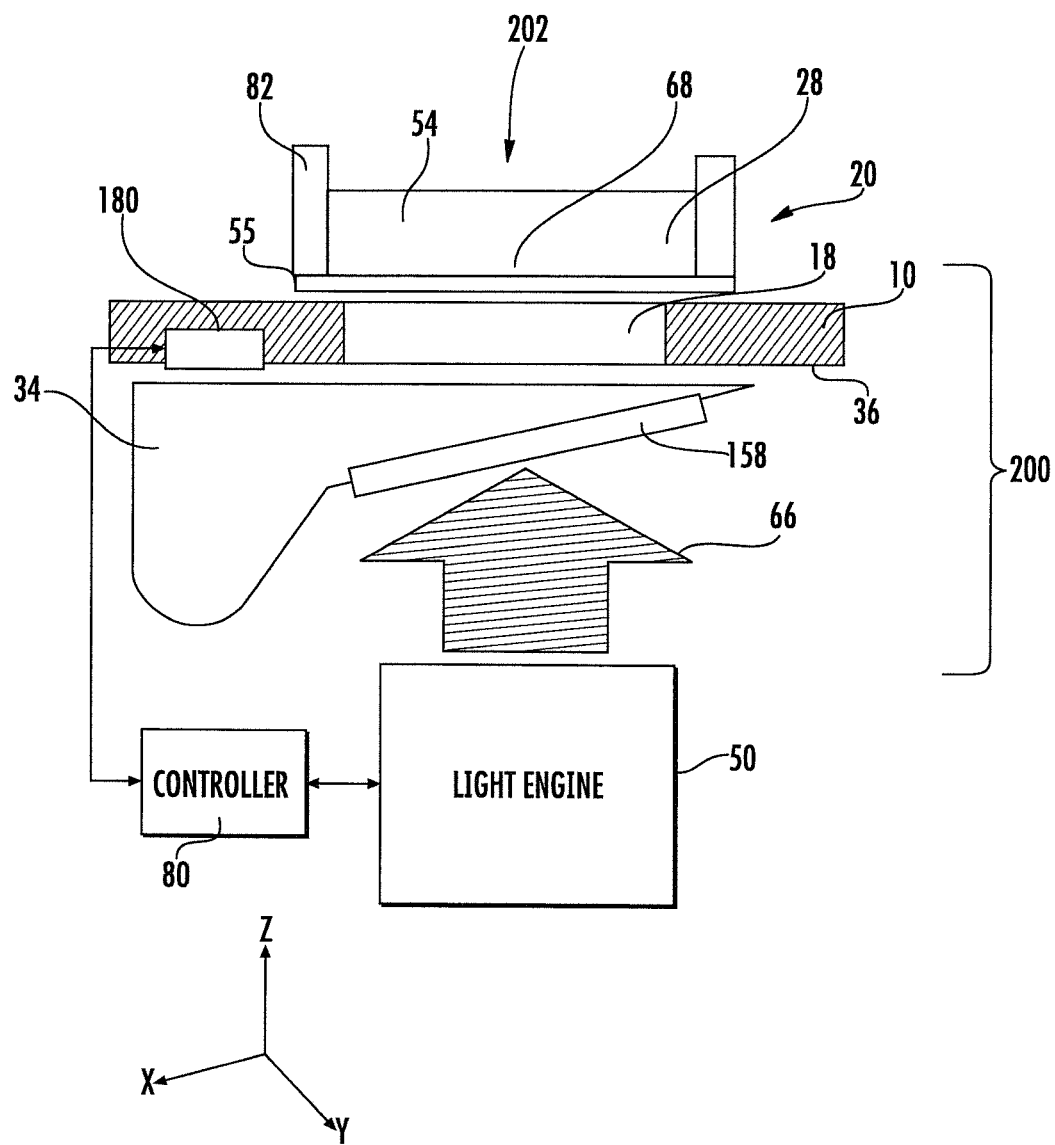
FIG. 12 is a side view schematic illustration of a sensor for detecting a filled condition for a fluid spill containment vessel.

FIG. 12 is a side view schematic diagram depicting a fluid spill containment vessel 34 mounted below a support plate 10 with a first embodiment of a fluid spill solution. One risk with this system is a slow leak in the resin vessel 20. As depicted in earlier illustrations and discussions the resin vessel 20 is automatically refilled. Over time, the fluid spill containment vessel 34 may become overfilled.

To avoid such overfilling, a sensor 180 is provided to detect a fluid level in the fluid spill containment vessel 34. Sensor 180 can be disposed proximate to the lower side 36 of the support plate 10. In one embodiment, sensor 180 is a non-contact sensor that is similar to fluid level sensor 32. In other embodiments sensor 180 is disposed in the fluid spill containment vessel 34 or proximate to a side of fluid spill containment vessel 34.

Sensor 180 provides a signal to the controller 80 that is indicative of the fluid level in the fluid spill containment vessel 34. When the controller 80 determines that the fluid level has reached a critical level, it will cease delivery of liquid resin from the resin supply 56 to the resin fluid outlet 30. The controller 80 will also trigger an alarm to alert a user of the three dimensional printing system 2 that the fluid spill containment vessel 34 is to be replaced, emptied and/or cleaned. In one embodiment the controller 80 halts operation of the printing system 2 when it is determined that any resin has leaked into the fluid spill containment vessel 34. This is because any resin that contacts the transparent window 158 will impair an optical path from the light engine 50 to the build plane 68.

Figure 13:
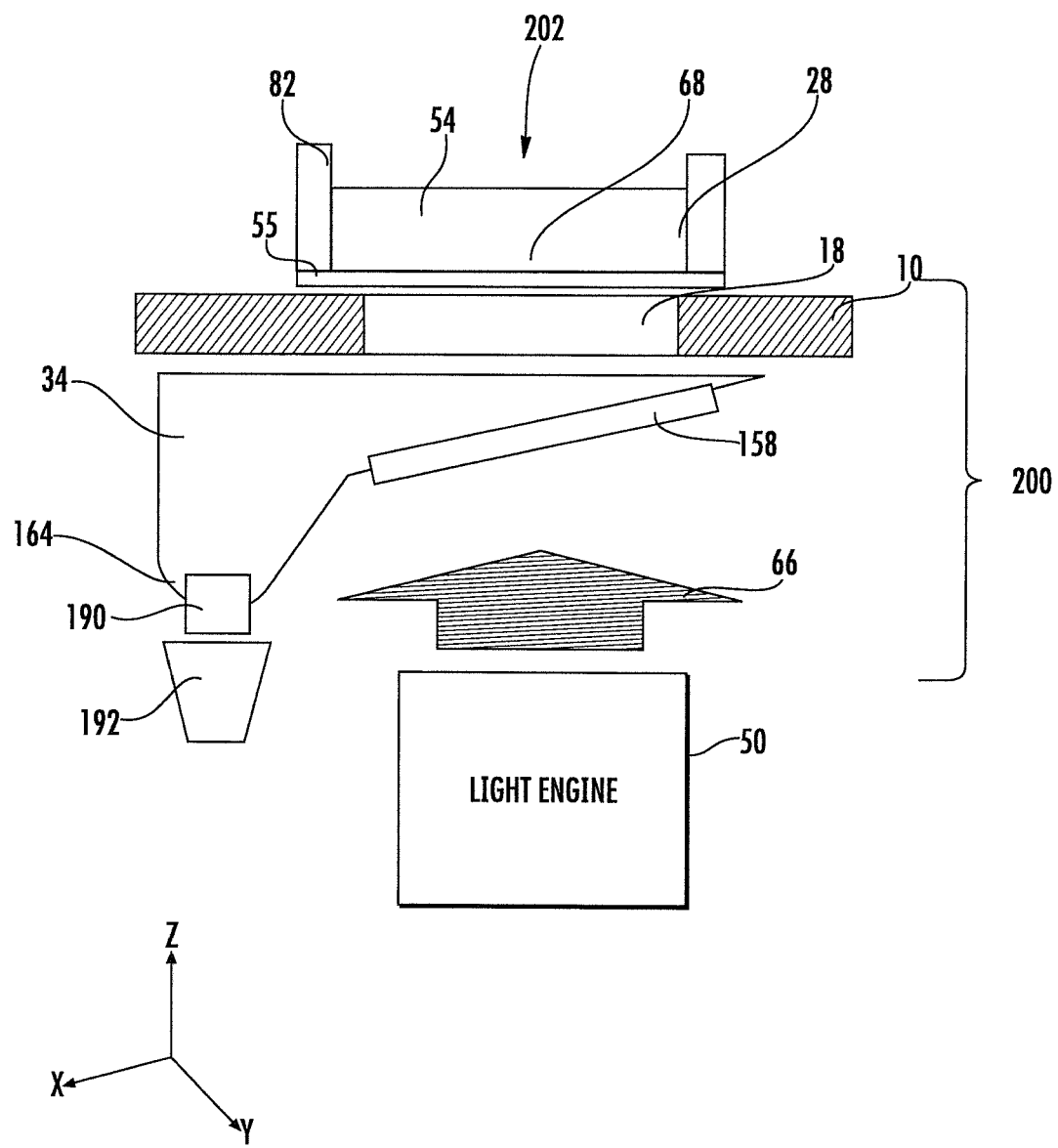
FIG. 13 is a side view schematic illustration of a drain system for a fluid spill containment vessel.

FIG. 13 is a side view schematic diagram depicting a fluid spill containment vessel 34 mounted below a support plate 10 with a second embodiment of a fluid spill solution. Fluid spill containment vessel 34 includes a fluid outlet 190 for releasing resin. Preferably the fluid outlet 190 is positioned to release resin from a lower extent of trough 164. Fluid outlet 190 is a "valved fluid outlet 190" because it includes a valve that is normally closed but can be opened to release fluid from fluid outlet 190.

Positioned below the fluid outlet 190 is a fluid drain conduit 192. In one embodiment the fluid outlet 190 includes a spring loaded stopper (not shown) that is biased to a closed position. When the fluid spill containment vessel 34 is loaded into the three dimensional printing system 2, the fluid outlet 190 is aligned and positioned above the fluid drain conduit 192. The fluid outlet 190 is configured to automatically open when it is positioned above the fluid drain conduit 192 so that spilled resin can drain from the fluid spill containment vessel 34 and into the fluid drain conduit 192.

A third embodiment of a fluid spill solution combines aspects of the first and second embodiments depicted in FIGS. 12 and 13 respectively. Even with a drain, it is still advantageous to provide an alert to a user when a spill has occurred. This is because any resin residue on transparent window 158 will variably deflect and attenuate light before it reaches the build plane 68 and will therefore reduce accuracy and quality of the three dimensional article of manufacture 72.

FIGS. 12 and 13 also depict portions of an optical path 200 from the light engine to the build plane 68. Optical path 200 includes the transparent window 158, the support plate central opening 18, and the resin vessel central opening 28, which collectively define a lateral area of overlap 202 along X and Y. The lateral area of overlap 202 is sufficient to allow pixelated light 66 to be projected along optical path 200 to define the build plane 68. The pixelated light 66 is projected along an optical axis that is generally vertically aligned with Z.

The specific embodiments and applications thereof described above are for illustrative purposes only and do not preclude modifications and variations encompassed by the scope of the following claims.

What is claimed:
1. A three dimensional printing system for fabricating a three dimensional article of manufacture comprising:
 a vertical support;
 a support plate affixed to the vertical support and extending therefrom along a first lateral axis from a proximal end to a distal end, the support plate having an inner surface defining a first central opening;
 a loadable resin vessel supported above the support plate has an inner edge surrounding a second central opening and includes a transparent sheet that closes the second central opening;

a loadable fluid spill containment vessel supported below the support plate, the loadable fluid spill containment vessel including a transparent window; and a light engine supported below the loadable fluid spill containment vessel;

the first central opening, the second central opening, and the transparent window laterally overlap to provide an optical path whereby the light engine can project light upwardly to a build plane in the loadable resin vessel, the transparent window slopes toward a portion of the loadable fluid spill containment vessel and resin that leaks onto the transparent window will flow off of the transparent window and to the portion of the loadable fluid spill containment vessel.

2. The three dimensional printing system of claim 1 wherein the loadable fluid spill containment vessel is configured to removably mount directly to a lower side of the support plate.

3. The three dimensional printing system of claim 2 further comprising a pair of rails mounted to a lower side of the support plate, the loadable fluid spill containment vessel includes a pair of lips that extend along the first lateral axis, the pair of lips are configured to be received into the pair of rails to thereby removably mount the loadable fluid spill containment vessel to the lower side of the support plate.

4. The three dimensional printing system of claim 1 wherein the loadable fluid spill containment vessel is configured to removably mount directly to the vertical support.

5. The three dimensional printing system of claim 1 wherein the loadable fluid spill containment vessel has distal and proximal ends, the loadable fluid spill containment vessel generally tapers from the distal end to the proximal end.

6. The three dimensional printing system of claim 5 wherein the portion of the loadable fluid spill containment vessel is a downwardly extending trough that is located at or adjacent to the distal end.

7. The three dimensional printing system of claim 6 wherein the transparent window is positioned proximate to the proximal end of the loadable fluid spill containment vessel to allow resin to drain from the transparent window and into the trough.

8. The three dimensional printing system of claim 7 wherein the trough includes a fluid drain to allow spilled resin to be drained from the trough.

9. The three dimensional printing system of claim 5 wherein the distal and proximal ends of the loadable fluid spill containment vessel correspond to the distal and proximal ends of the support plate whereby the loadable fluid spill containment vessel generally tapers along the lateral axis along a direction from the distal to the proximal ends of the support plate.

10. The three dimensional printing system of claim 1 further comprising:

a sensor configured to detect a fluid level in the loadable fluid spill containment vessel; and a controller configured to receive a signal from the sensor and to generate a warning if a fluid level in the fluid spill containment vessel exceeds a threshold value.

11. The three dimensional printing system of claim 1 further comprising a fluid drain configured to allow resin to drain from the loadable fluid spill containment vessel.

12. The three dimensional printing system of claim 11 further comprising a drain conduit supported below the fluid drain when the loadable fluid spill containment vessel is installed into the three dimensional printing system.

13. The three dimensional printing system of claim 12 wherein the fluid drain automatically opens when the loadable fluid spill containment vessel is installed in the three dimensional printing system whereby resin in the fluid spill containment vessel will drain into the drain conduit.

14. The three dimensional printing system of claim 1 wherein the portion of the loadable fluid spill containment vessel is a downwardly extending trough for accumulating the resin that flows off of the transparent window.

\* \* \* \* \*